US012801812B2

(12) United States Patent
Mezghanni et al.

(10) Patent No.: US 12,801,812 B2
(45) Date of Patent: Nov. 17, 2026

(54) DEEP PARAMETERIZATION FOR 3D SHAPE OPTIMIZATION

(71) Applicants: DASSAULT SYSTEMES, Vélizy-Villacoublay (FR); ECOLE POLYTECHNIQUE, Palaiseau Cedex (FR); CNRS, Paris Cedex (FR)

(72) Inventors: Mariem Mezghanni, Vélizy-Villacoublay (FR); Théo Bodrito, Chateaurenard (FR); Malika Boulkenafed, Vélizy-Villacoublay (FR); Maks Ovsjanikov, Palaiseau (FR)

(73) Assignees: DASSAULT SYSTEMES, Vélizy-Villacoublay (FR); ECOLE POLYTECHNIQUE, Palaiseau Cedex (FR); CNRS, Paris Cedex (FR)

( * ) Notice: Subject to any disclaimer, the term of this patent is extended or adjusted under 35 U.S.C. 154(b) by 1205 days.

(21) Appl. No.: 17/829,987

(22) Filed: Jun. 1, 2022

(65) Prior Publication Data

US 2022/0405448 A1 Dec. 22, 2022

(30) Foreign Application Priority Data

Jun. 1, 2021 (EP) .................................... 21305729

(51) Int. Cl.

*G06F 30/27* (2020.01)
*G06F 30/17* (2020.01)
*G06N 3/088* (2023.01)

(52) U.S. Cl.

CPC .............. *G06F 30/27* (2020.01); *G06F 30/17* (2020.01); *G06N 3/088* (2013.01)

(58) Field of Classification Search

CPC .......... G06F 30/00; G06F 30/27; G06F 30/17; G06N 3/088; G06N 3/0455; G06N 3/0499; G06N 3/045; G06N 3/09; G06N 3/084

(Continued)

(56) References Cited

U.S. PATENT DOCUMENTS

2021/0004719 A1* 1/2021 Dupont De Dinechin .................. G06N 20/00
2021/0150231 A1* 5/2021 Kehl ..................... G01S 7/4802

FOREIGN PATENT DOCUMENTS

EP 3 757 903 A1 12/2020
JP 2019-3615 A 1/2019
JP 2021-12693 A 2/2021

OTHER PUBLICATIONS

Wang, Yuyang et al., "Airfoil GAN: Encoding and Synthesizing Airfoils for Aerodynamic Shape Optimization", 2000, Journal of Computational Design and Engineering, The Authors. (Year: 2020).*

(Continued)

*Primary Examiner* — Cedric Johnson
(74) *Attorney, Agent, or Firm* — Oblon, McClelland, Maier & Neustadt, L.L.P.

(57) ABSTRACT

A computer-implemented method of machine-learning. The method comprises providing a dataset of 3D modeled objects each representing a mechanical part. Each 3D modeled object comprises a specification of a geometry of the mechanical part. The method further comprises learning a set of parameterization vectors each respective to a respective 3D modeled object of the dataset and a neural network configured to take as input a parameterization vector and to output a representation of a 3D modeled object usable in a differentiable simulation-based shape optimization. The learning comprises minimizing a loss that penalizes, for each 3D modeled object of the dataset, a disparity between (Continued)

the output of the neural network for an input parameterization vector respective to the 3D modeled object and a representation of the 3D modeled object. The representation of the 3D modeled object is usable in a differentiable simulation-based shape optimization.

18 Claims, 17 Drawing Sheets

(58) Field of Classification Search
USPC .............................................................. 703/2
See application file for complete search history.

(56) References Cited

OTHER PUBLICATIONS

Extended European Search Report issued Nov. 4, 2021 in European Patent Application No. 21305729.2 filed Jun. 1, 2021, 11 pages.
Whiting, E., et al., "Structural Optimization of 3D Masonry Buildings", ACM Transactions on Graphics, 2012, 12 total pages.
Zhou, Y., et al., "Direct shape optimization for strengthening 3D printable objects," Computer Graphics Forum, vol. 35, No. 7, Wiley Online Library, 2016, pp. 333-342, 10 total pages.
Cabrera, D.M., "Evolutionary algorithms for large-scale global optimisation: a snapshot, trends and challenges", Progress in Artificial Intelligence, vol. 5, No. 2, 2016. pp. 85-89.
Andreassen, E., et al., "Efficient topology optimization in MATLAB using 88 lines of code", Structural and Multidisciplinary Optimization, vol. 43, No. 1, 2011, pp. 1-16.
Sigmund, O., "A 99 line topology optimization code written in Matlab", Structural and Multidisciplinary Optimization, vol. 21, No. 2, 2001, pp. 120-127.
Zhu, J.H., et al., "Topology optimization in aircraft and aerospace structures design", Archives of Computational Methods in Engineering, vol. 23, No. 4, 2016, pp. 595-622.
Umetani, N., et al., "Guided exploration of physically valid shapes for furniture design", ACM Transactions on Graphics, vol. 31, No. 4, 2012, 1 total page (with English Abstract).
Bächer M., et al., "Spin-it: Optimizing moment of inertia for spinnable objects", ACM Trans. Graph. vol. 33, No. 4, 2014, 10 total pages.
Kim, N.H., et al., "Numerical method for shape optimization using mesh free method", Structural and Multidisciplinary Optimization, vol. 24, No. 6, 2002, pp. 418-429.
Banga, S., et al., "3D Topology Optimization Using Convolutional Neural Networks" arXiv preprint arXiv:1808.07440, 2018, pp. 1-21.
Sosnovik, I., et al., "Neural networks for topology optimization", Russian Journal of Numerical Analysis and Mathematical Modelling, vol. 34, No. 4, 2019, pp. 215-223.
Alter, A., "Structural Topology Optimization using a Convolutional Neural Network", preprint, 2018, pp. 1-6, URL http://cs230.stanford.edu/files_winter_2018/projects/6907833.pdf.
Jiang, J., et al., "Free-Form Diffractive Metagrating Design Based on Generative Adversarial Networks", ACS Nano, vol. 13, No. 8, 2019, pp. 8872-8878 doi: 10.1021/acsnano.9b02371, URL https://pubs.acs.org/doi/10.1021/acsnano.9b02371, or https://fanlab.stanford.edu/wp-content/papercite-data/pdf/jiang2019free.pdf, PMID: 31314492.
Chandrasekhar, A., et al., "Topology Optimization using Neural Networks", Structural and Multidisciplinary Optimization, 2020, pp. 1-19.
Hoyer, S., et al., "Neural reparameterization improves structural optimization", NeurIPS, Deep Inverse Workshop, 2019, pp. 1-22.
Richards, D. et al., "Shape Optimization with Surface-Mapped CPPNs", IEEE Transactions on Evolutionary Computation, 2016, PP(99), pp. 1-18.
Lorensen, W., et al., "Marching Cubes: A High Resolution 3D Surface Construction Algorithm", In Proceedings of the 14th Annual Conference on Computer Graphics and Interactive Techniques, vol. 21, No. 4, 1987, pp. 163-169.
Park, J., et al., "DeepSDF: Learning Continuous Signed Distance Functions for Shape Representation", IEEE Conference on Computer Vision and Pattern Recognition (CVPR), 2019, pp. 165-174.
Hu, Y., et al. "DiffTaichi: Differentiable Programming for Physical Simulation", ICLR, 2020, pp. 1-20.
Baraff, D., et al., "An Introduction to Physically Based Modeling: Rigid Body Simulation I—Unconstrained Rigid Body Dynamics", 1997, p. D1-D32.
Baraff, D., et al., "An Introduction to Physically Based Modeling: Rigid Body Simulation II—Nonpenetration Constraints", 1997, p. D32-D68.
Atkinson, K., "An Introduction to Numerical Analysis", John Wiley & Sons, 2008, 663 total pages.
Remelli, E., et al., "MeshSDF: Differentiable Iso-Surface Extraction", Advances in Neural Information Processing Systems, 2020, pp. 1-22.
Williams, R.J., "Simple Statistical Gradient-Following Algorithms for Connectionist Reinforcement Learning", MLJ 8(3-4), 1992, pp. 1-27.
Rumelhart, D.E., et al., "Learning Internal Representations by Error Propagation", Parallel distributed processing: explorations in the microstructure of cognition, vol. 1: foundations, MIT Press, 1986, pp. 318-362.
Hennigh, O., "Automated Design using Neural Networks and Gradient Descent", arxiv.org, Cornell University Library, 2017, XP080832477, pp. 1-12.
Wang, Y., et al., "Airfoil GAN: Encoding and Synthesizing Airfoils for Aerodynamic-aware Shape Optimization", arxiv.org, Cornell University Library, 2021, XP081858322, pp. 1-24.
Japanese Office Action issued Feb. 10, 2026, in corresponding Japanese Patent Application No. 2022-089502 (with English Translation), 9 pages.

* cited by examiner $$\nabla_z \tilde{\mathcal{L}}_{func}(z) = \sum_i \delta_{SDF}^i \nabla_z \phi(z, x_i)$$

$$\mathcal{L}_{reconstruction} = BCE(sigmoid(-\eta * SDF), SDF_{init} < 0); \eta = 1000$$

$$\mathcal{L}_{total} = \mathcal{L}_{func} + \alpha ||z - z_{init}||_2 + \beta * \mathcal{L}_{reconstruction}; \ \beta = 0.03$$

DEEP PARAMETERIZATION FOR 3D SHAPE OPTIMIZATION

CROSS-REFERENCE TO RELATED APPLICATIONS

This application claims priority under 35 U.S.C. § 119 or 365 to European Application No. 21305729.2, filed Jun. 1, 2021. The entire contents of the above application(s) are incorporated herein by reference.

TECHNICAL FIELD

The disclosure relates to the field of computer programs and systems, and more specifically to methods, a system and a program for differentiable simulation-based shape optimization.

BACKGROUND

A number of systems and programs are offered on the market for the design, the engineering and the manufacturing of objects. CAD is an acronym for Computer-Aided Design, e.g., it relates to software solutions for designing an object. CAE is an acronym for Computer-Aided Engineering, e.g., it relates to software solutions for simulating the physical behavior of a future product. CAM is an acronym for Computer-Aided Manufacturing, e.g., it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systérnes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Within this context and other contexts, shape optimization is gaining wide importance.

Shape optimization improves existing designs for more reliable and durable components. Example optimizations tasks aim to optimize stress, strain, and durability by automatic simulation-driven modification of the shape geometry. This field has a rich history motivated by applications ranging from structural mechanics to electromagnetism. Real-world shape optimization problems may easily comprise thousands of vertices. Search efficiency and scalability remain a challenge is this field.

Existing methods are so computationally demanding that typical engineering practices are to either simply try a limited number of hand-designed shapes or restrict oneself to shapes that can be parameterized using only few degrees of freedom. Typically, existing optimization strategies may involve simplifying the shape's degrees of freedom by reducing the search space size, i.e., limiting the number of candidate shapes.

Within this context, there is a need for an improved solution for shape optimization.

SUMMARY

It is therefore provided a computer-implemented method of machine-learning. The method comprises providing a dataset of 3D modeled objects each representing a mechanical part. Each 3D modeled object comprises a specification of a geometry of the mechanical part. The method further comprises learning a set of parameterization vectors each respective to a respective 3D modeled object of the dataset and a neural network. The neural network is configured to take as input a parameterization vector and to output a representation of a 3D modeled object usable in a differentiable simulation-based shape optimization. The learning comprises minimizing a loss. The loss penalizes, for each 3D modeled object of the dataset, a disparity between the output of the neural network for an input parameterization vector respective to the 3D modeled object and a representation of the 3D modeled object. The representation of the 3D modeled object is usable in a differentiable simulation-based shape optimization.

The method may comprise one or more of the following:
- the representation is an implicit representation;
- the implicit representation is a signed distance field representation;
- the set of parameterization vectors is a set of latent vectors; and/or
- each 3D modeled object of the provided dataset further comprises a specification of one or more physical attributes of the mechanical part, and the representation is a representation of the geometry and of the one or more physical attributes.

It is further provided a neural network learnable (e.g., having been learnt) according to the method. The neural network is a computer-implemented data structure having weights (also referred to as "parameters") settable (e.g., having been set) by the learning according to the method. The neural network is:
- a decoding neural network, configured to take as input a parameterization vector of a 3D modeled object and to output a representation of the 3D modeled object usable in a differentiable simulation-based shape optimization; or
- an autoencoder, comprising an encoder configured to take as input a 3D modeled object and to output a parameterization of the 3D modeled object, and a decoder configured to take as input a parameterization vector of a 3D modeled object and to output a representation of the 3D modeled object usable in a differentiable simulation-based shape optimization.

It is further provided a method of use of the neural network for differentiable simulation-based shape optimization. The method of use comprises providing a 3D modeled object representing a mechanical part, one or more physical constraints on the 3D modeled object, and a differentiable simulator. The differentiable simulator takes as input a representation of a 3D modeled object and outputs a value. The value represents an extent to which the 3D modeled object respects the one or more physical constraints. The method of use further comprises performing a simulation-based shape optimization of the 3D modeled object by minimizing a loss. The loss penalizes a disparity between the value outputted by the simulator for the output of the neural network for a candidate parameterization vector and an optimal output of the simulator with respect to the one or more physical constraints.

The method of use may comprise:

- the output of the neural network is an explicit representation of the 3D modeled object parameterized by the candidate parameterization vector and the simulator takes as input an explicit representation of a 3D modeled object, or the output of the neural network is an implicit representation of the 3D modeled object parameterized by the candidate parameterization vector and the simulator takes as input an explicit representation of a 3D modeled object, the performing of the simulation-based shape optimization comprising transforming the implicit representation of the 3D modeled object into an explicit representation;
- the loss further penalizes a disparity between a 3D modeled object parameterized by the candidate parameterization vector and the provided 3D modeled object;
- the disparity between the 3D modeled object parameterized by the candidate parameterization vector and the 3D modeled object comprises:
  - a disparity between the candidate parameterization vector and a parameterization vector of the provided 3D modeled object, the parameterization vector being obtained from the provided 3D modeled object; and/or
  - a disparity between the output of the neural network for the candidate parameterization vector and a representation of the provided 3D modeled object;
- the loss if of the type:

$$d_{\mathbb{R}}(\Psi_0\Phi(v', \mathcal{G}_R), f_{opt}) + \alpha\, d_{\mathbb{R}^D}(v, v') + \beta\, d_S(\Phi(v', \mathcal{G}_R), O),$$

where $\Phi(v', \mathcal{G}_R)$ is the output of the neural network $\Phi$ for the candidate parameterization vector $v'$, $\Psi$ is the simulator, $f_{opt}$ is the optimal output of the simulation with respect to the one or more physical constraints, $v$ is the parameterization vector of the provided 3D modeled object, $O=\Phi(v, \mathcal{G}_R)$ is the representation of the provided 3D modeled object, $d_{\mathbb{R}}$, $d_{\mathbb{R}^D}$, $d_S$ are distances, and $\alpha$ and $\beta$ are coefficients of the loss; and/or
- the output of the neural network for an input candidate parameterization vector is an implicit representation of the 3D modeled object parametrized the input parameterization vector, the implicit representation being a signed distance field, the simulator takes as input an explicit representation of a 3D modeled object, and the distance $d_S$ is of the type:

$$d_S(\Phi(v_1, \mathcal{G}_R), \Phi(v_2, \mathcal{G}_R)) = BCE\left(B^{\sigma}(v_2), B^{\mathbb{I}}(v_1)\right),$$

where for i=1, 2, $v_i$ is a parameterization vector, $\Phi(v_i, \mathcal{G}_R)$ is the output of the neural network for the parameterization vector being the neural network, where $$B^{\mathbb{I}}(v) = \{\mathbb{I}_{\Phi(v,x)<0};\, x \in \mathcal{G}_R\},$$

$$B^{\sigma}(v) = \left\{\sigma\left(\eta^{\Phi}(v, x)\right);\, x \in \mathcal{G}_R\right\},$$

$\eta$ being a negative real number, $\mathbb{I}$ and $\sigma$ being respectively the indicator and the sigmoid functions, $\mathcal{G}_R$ being a grid of regularly spaced coordinates, and where BCE is a binary cross entropy distance between two sets X and $\mathcal{Y}$ with size n such as $\forall x \in X \cup \mathcal{Y}$, $x \in [0,1]$ and is given by the formula $$BCE(X, \mathcal{Y}) = \frac{1}{n}\sum_{i=1}^{n} y_i \log(x_i) + (1 - y_i)\log(1 - x_i),$$

where the $x_i$ are the points of X and where the $y_i$ are the points of $\mathcal{Y}$.

It is further provided a computer program comprising instructions for performing the method and/or the method of use.

It is further provided a device comprising a computer-readable data storage medium having recorded thereon the computer program and/or the neural network.

The device may form or serve as a non-transitory computer-readable medium, for example on a SaaS (Software as a service) or other server, or a cloud based platform, or the like. The device may alternatively comprise a processor coupled to the data storage medium. The device may thus form a computer system in whole or in part (e.g., the device is a subsystem of the overall system). The system may further comprise a graphical user interface coupled to the processor.

BRIEF DESCRIPTION OF THE DRAWINGS

Non-limiting examples will now be described in reference to the accompanying drawings, where.

DETAILED DESCRIPTION

Figure 1:
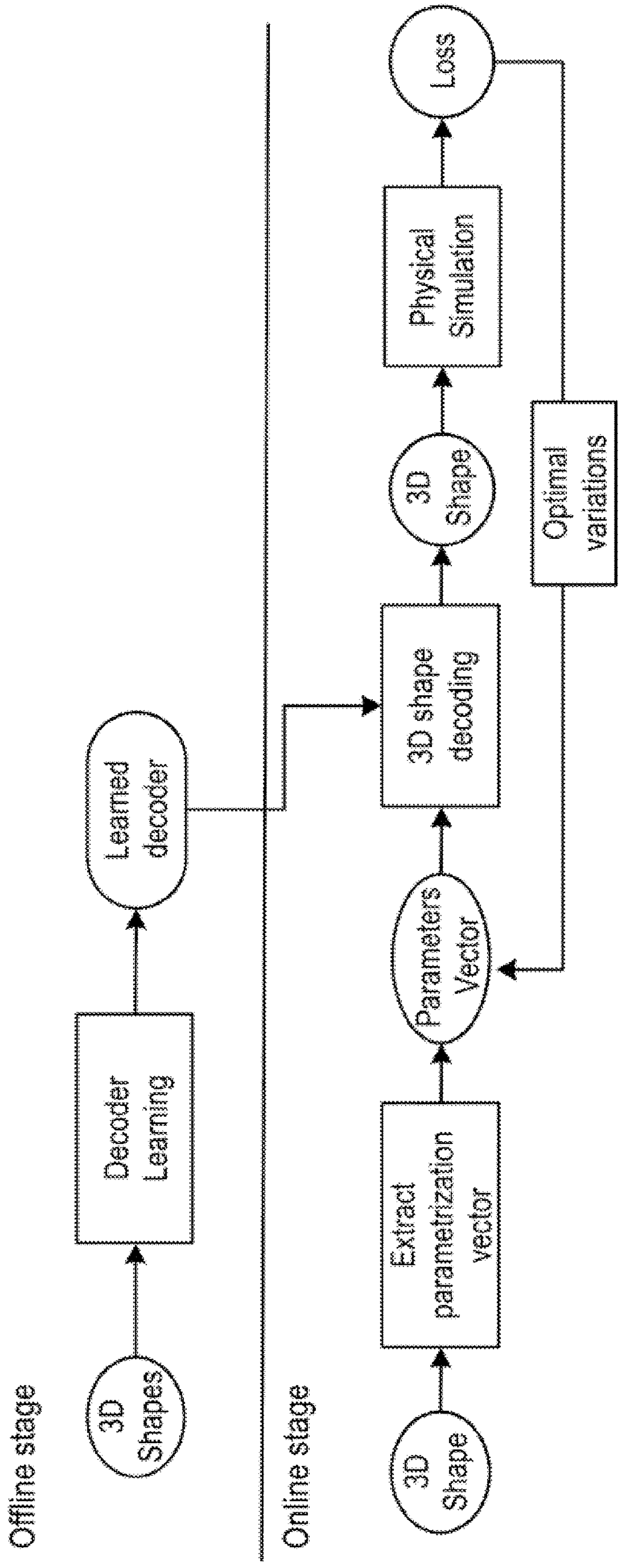
FIGS. 1, 2, 3, 4, 5, 6, 7, 8, 9, 10, 11, 12, 13, 14, 15, 16, and 17 illustrate the methods.

Discussed is a computer-implemented method of machine-learning. The method comprises providing a dataset of 3D modeled objects each representing a mechanical part. Each 3D modeled object comprises a specification of a geometry of the mechanical part. The method further comprises learning a set of parameterization vectors each respective to a respective 3D modeled object of the dataset and a neural network. The neural network is configured to take as input a parameterization vector and to output a representation of a 3D modeled object usable in a differentiable simulation-based shape optimization. The learning comprises minimizing a loss. The loss penalizes, for each 3D modeled object of the dataset, a disparity between the output of the neural network for an input parameterization vector respective to the 3D modeled object and a representation of the 3D modeled object. The representation of the 3D modeled object is usable in a differentiable simulation-based shape optimization. The method may be referred to as "the learning method".

The learning method constitutes an improved solution for differentiable simulation-based shape optimization.

Notably, the learning method provides a solution to perform a resource-saving yet accurate and high-quality differentiable simulation-based shape optimization. Indeed, the learning method learns a set of parameterization vectors, each respective to a 3D modeled object of the provided dataset (i.e., the training dataset), i.e., each vector parameterizes (e.g., encodes) a respective 3D modeled object. In other words, each parameterization vector is a vector representation of the corresponding respective 3D modeled object, capturing its geometry and optionally physical attributes thereof, since the 3D modeled object is provided with a specification of a geometry of the mechanical part it represents and optionally with a specification of the physical attributes of the part. Yet the parameterization vector, which for example may be a latent vector, has a dimension lower than that of the 3D modeled object. This implies the following: the parameterization vector costs less in terms of storage requirements than the corresponding 3D modeled object, and when used in a differentiable simulation-based optimization, the parameterization vector reduces the memory (i.e., random access memory, also referred to as "RAM") footprint and the burden on the CPU (central processing unit).

Each learnt parameterization vector is indeed usable in a differentiable simulation-based shape optimization, because the learning method learns, in addition of the set of parameterization vectors, a neural network configured to take such a vector as input and to output a representation of the corresponding respective 3D modeled object, the representation being usable in a differentiable simulation-based shape optimization. Thus the neural network forms a mapping between the learnt space of parameterization vectors and a representation space compatible with a differentiable simulation-based shape optimization. Moreover, it is to be noted that the learnt set of parameterization vectors does not limit the shape optimization to the 3D modeled objects of the provided dataset. Indeed, the learnt set of parameterization vectors form a low-dimensional space of parameterization vectors based on which the optimization may then be made, i.e., the space of the parameterization vectors is a search space of the optimization. 3D modeled objects other that the ones in the provided dataset may be optimized by the optimization using the space of parameterization vectors, as a parameterization vector of a 3D modeled object not belonging to the set may still be obtained based on the learnt neural network, for example by performing a minimization (e.g., a Maximum a Posterior estimation) based on the learnt neural network to obtain this vector, or for example by encoding the 3D modeled object if the neural network is an autoencoder.

Thus, while a differentiable simulation-based shape optimization is normally computationally-demanding as previously discussed, the learning method circumvent these difficulties by finding a parameterization space (e.g., a latent space) for the free variables of the optimization with the consideration that vectors of this space, due to their reduced dimension, may efficiently be used in the optimization, i.e., with a reduced footprint on the RAM and a reduced burden on the CPU, while keeping a high quality result of the simulation, since the vectors still capture the geometry, and optionally the physical attributes, of the underlying mechanical parts to optimize. In yet other words, the learning method provides a data structure compatible with a differentiable simulation-based simulation, i.e., usable in such a simulation, and allowing an efficient, in terms of memory footprint and CPU usage, implementation of the optimization on a computer system with yet high quality results. For example, the learning method allows not to restrict the candidates of the optimization (i.e., the space or variety of possible solutions) due to computational limitations imposed by the underlying computer system.

It is further provided a method of use of the neural network for differentiable simulation-based shape optimization. The method of use comprises providing a 3D modeled object representing a mechanical part, one or more physical constraints on the 3D modeled object, and a differentiable simulator. The differentiable simulator takes as input a representation of a 3D modeled object and outputs a value. The value represents an extent to which the 3D modeled object respects the one or more physical constraints. The method of use further comprises performing a simulation-based shape optimization of the 3D modeled object by minimizing a loss. The loss penalizes a disparity between the value outputted by the simulator for the output of the neural network for a candidate parameterization vector and an optimal output of the simulator with respect to the one or more physical constraints. The method of use may be referred to as "the optimization method".

The optimization method is method of differentiable simulation-based shape optimization, for optimizing the shape of the mechanical part represented by the provided 3D modeled object with respect to the one or more physical constraints (for example, optimizing the mechanical part with respect to stiffness constraints) and based on a differential simulator that measures an extent of respect of the constraints. The loss involved in the minimization involves candidate parameterization vector, i.e., the free variable of the minimization is a parameterization vector and the space of the free-variables, in which the minimization explores candidate optimums, is the parameterization vector space. Thereby, the optimization works in a low-dimensional space (e.g., a latent space) learnable according to the learning method, thus having as previously explained a dimension lower than that of a 3D modeled object space, so that, as previously explained, the memory footprint and the burden on the CPU are reduced during the optimization without the need of restricting or simplifying the space of potential solutions. In other words, the optimization provides a quality result while working on a space learnt to allows the optimization to be resource-saving and efficiently implemented on a computer, from the viewpoint of the memory footprint and CPU burden as previously explained.

The optimization method may be part of a manufacturing CAD (also referred to as "solid modeling") process, to design a mechanical part to be manufactured downstream of the manufacturing CAD process based on a 3D volume model (i.e., solid model) of the mechanical part. The optimization method may be a step of such a process, to optimize the shape of the mechanical part with respect to one or more physical constraints, which may include manufacturing constraints of the mechanical part and/or constraints on the physical performances of the mechanical part once manufactured. The optimization method outputs an optimized version of the 3D solid representing the mechanical part with respect to the constraint, which may be then further modified by further downstream CAD design steps and/or then serve as a basis for manufacturing the mechanical part. The optimization method contributes to a more efficient, resource-saving and time-saving design process as the optimization is automatically performed, in a one-shot efficient computation. In other words, the shape optimization step of the design process is automated by a resource-saving optimization method, which saves time and computer-resources, as well as improving ergonomics and design assistance for the designer.

The learning method and the optimization method may be performed independently. Alternatively, they may be integrated into a same computer implemented process, which may be, or may be integrated to, the previously discussed manufacturing CAD process. The process integrating the learning method and the optimization method comprises an offline stage, consisting of the learning method, and an online stage, consisting of the optimization method. FIG. 1 shows a flowchart of an example of such a process.

The learning method is now further discussed. The learning method is a machine-learning method, i.e., a method of machine-learning.

As known per se from the field of machine-learning, the processing of an input by a neural network includes applying operations to the input, the operations being defined by data including weight values. Learning a neural network thus includes determining values of the weights based on a dataset configured for such learning, such a dataset being possibly referred to as a learning dataset or a training dataset. For that, the dataset includes data pieces each forming a respective training sample. The training samples represent the diversity of the situations where the neural network is to be used after being learnt. Any training dataset herein may comprise a number of training samples higher than 1000, 10000, 100000, or 1000000. In the context of the present disclosure, by "learning a neural network based on a dataset", it is meant that the dataset is a learning/training dataset of the neural network, based on which the values of the weights (also referred to as "parameters") are set.

In the context of the learning method, the training dataset is thus the provided dataset of 3D modeled objects each representing a mechanical part. Each training sample includes a 3D modeled object, which comprises a specification of the geometry of the mechanical part, i.e., data capturing the geometry of the mechanical part. Each 3D modeled object may further comprise a specification of one or more physical attributes of the mechanical part. The one or more physical attributes may comprise one or more of a segmentation of the corresponding mechanical part, a volumetric mass density, a thermal conductivity, a specific heat, a thermal expansion, a stiffness, an electrical resistivity, a conductivity and/or a motion attribute. The 3D modeled objects of the training dataset may represent mechanical parts of a same class (e.g., chairs, planes or cars), in which case any 3D modeled object undergoing the optimization in the optimization method represents a mechanical part of the same class.

The learning method thus manipulates 3D modeled objects The optimization method as well. A 3D modeled object is any object defined by data stored e.g., in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

Any 3D modeled object herein represents a mechanical part, to be manufactured in a real world, e.g., downstream to a manufacturing CAD process such as the one previously discussed. By "3D modeled object", it is meant any object which is modeled by data allowing its 3D representation. A 3D representation allows the viewing of the part from all viewpoints (e.g., from various angles and/or distances). For example, a 3D modeled object, when 3D represented, may be handled and turned around any of its axes, or around any axis in the screen on which the representation is displayed. This notably excludes 2D icons, which are not 3D modeled. The 3D modeled object represents the geometry of a product to be manufactured in the real world subsequent to the completion of its virtual design with for instance a CAD software solution or CAD system, such as a (e.g., mechanical) part or assembly of parts (or equivalently an assembly of parts, as the assembly of parts may be seen as a part itself from the point of view of the methods), or more generally any rigid body assembly (e.g., a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object may thus represent an industrial product which may be any mechanical part, such as a part of a terrestrial vehicle (including e.g., car and light truck equipment, racing cars, motorcycles, truck and motor equipment, trucks and buses, trains), a part of an aerial vehicle (including e.g., airframe equipment, aerospace equipment, propulsion equipment, defense products, airline equipment, space equipment), a part of a naval vehicle (including e.g., navy equipment, commercial ships, offshore equipment, yachts and workboats, marine equipment), a general mechanical part (including e.g., industrial manufacturing machinery, heavy mobile machinery or equipment, installed equipment, industrial equipment product, fabricated metal product, tire manufacturing product), an electro-mechanical or electronic part (including e.g., consumer electronics, security and/or control and/or instrumentation products, computing and communication equipment, semiconductors, medical devices and equipment), a consumer good (including e.g., furniture, home and garden products, leisure goods, fashion products, hard goods retailers' products, soft goods retailers' products), a packaging (including e.g., food and beverage and tobacco, beauty and personal care, household product packaging).

Any 3D modeled object herein may form a discrete geometrical representation of a 3D real-world object which is a mechanical part. The discrete geometrical representation is herein a data structure which comprises a discrete set of pieces of data. Each piece of data represents a respective geometrical entity positioned in a 3D space. Each geometrical entity represents a respective location of the 3D object (in other words, a respective portion of material constitutive of a solid represented by the 3D object). The aggregation (i.e., union or juxtaposition) of the geometrical entities represents altogether the 3D object. Any discrete geometrical representation herein may in examples comprise a number of such pieces of data higher than 100, 1000, or 10000.

Any discrete geometrical representation herein may for example be a 3D point cloud, each geometrical entity being a point. Any discrete geometrical representation herein may alternatively be a 3D mesh, each geometrical entity being a mesh tile or face. Any 3D mesh herein may be regular or irregular (i.e., consisting or not of faces of a same type). Any 3D mesh herein may be a polygonal mesh, for example a triangular mesh. Any 3D mesh herein may alternatively be a B-Rep. Any 3D mesh herein may be obtained from a 3D point cloud, for example by triangulating the 3D point cloud (e.g., with a Delaunay triangulation). Any 3D point cloud herein may be determined from physical measurements on a real object, for example within a 3D reconstruction process. The 3D reconstruction process may comprise providing the real object, providing one or more physical sensors each configured for acquiring a respective physical signal, and acquiring one or more respective physical signals by operating the one or more physical sensors on the real object (i.e., scanning the real object with each sensor). The 3D reconstruction may then automatically determine a 3D point cloud and/or a 3D mesh based on the measurements, according to any known technique. The one or more sensors may comprise a plurality of (e.g., RGB, and/or image or video) cameras and the determination may comprise a structure-from-motion analysis. The one or more sensors may alternatively or additionally comprise one or more depth sensors (e.g., on an RGB-depth camera) and the determination may comprise a 3D reconstruction from depth data. The one or more depth sensors may for example comprise a laser (e.g., a lidar) or an ultrasound emitter-receiver. Any discrete geometrical representation herein may alternatively be any type of CAD model.

Any 3D point cloud or 3D mesh herein may alternatively be obtained from a 3D modeled object representing a skin (i.e., outer surface) of a solid (e.g., corresponding to B-Rep model, which represents a skin, i.e., an exact surface), for example by ray-casting on the 3D modeled object or tessellating the 3D modeled object. The tessellating may be performed according to any 3D modeled object rendering process. Such a rendering process may be coded on any CAD system in order to display a graphical representation of the 3D modeled object. The 3D modeled object may be designed or have been designed by a user with a CAD system.

Any discrete geometrical representation herein may alternatively be a voxel representation. Voxel is a natural extension of pixels for 2D representations. Voxel is an image of a three-dimensional space region limited by given sizes, which has its own nodal point coordinates in an accepted coordinate system, its own form, its own state parameter that indicates its belonging to some modeled object, and has properties of modeled region.

Any 3D modeled object herein may alternatively be represented by an implicit representation, i.e., a representation by an implicit function, for example the signed distance function. An implicit function is a function defined over the 3D space where the 3D modeled object surface corresponds the isosurface of this function. That isosurface is a surface that represents points of a constant value (e.g., distance to the shape surface) within a volume of space. In other words, it is a level set of a function whose domain is a 3D-space.

The learning method then learns, based on the provided dataset of 3D modeled objects, a set of parameterization vectors and a neural network. The learning is now discussed.

The neural network is configured to take as input a parameterization vector and to output a representation of a 3D modeled object usable in a differentiable simulation-based shape optimization.

The neural network may be a decoding neural network (e.g., a decoder), configured to take as input the parameterization vector and to output the representation of the 3D modeled object. In such a case, the neural network provides a mapping between an input representation vector and a representation of a 3D modeled object usable in a differentiable simulation-based optimization (i.e., a representation that is usable in such an optimization). The decoding neural network is however not in this case configured to encode a 3D modeled object into a parameterization vector, but the neural network may be used to obtain the parameterization vector of the 3D modeled object, for example using an optimization based on the learnt neural network (e.g., by computing a Maximum A Posterior Estimation, as discussed hereinafter).

Alternatively, the neural network may be an autoencoder. The autoencoder comprises an encoder, configured to take as input a 3D modeled object and to output a parameterization vector of the 3D modeled object, i.e., to encode the 3D modeled object into a parameterization vector. The autoencoder further comprises a decoder, configured to take as input a parameterization vector and to output the 3D modeled object encoded by the parameterization vector, i.e., to decode the parameterization vector into the 3D modeled object. Thus, in this case, the neural network is both configured to take as input a 3D modeled object and to output a parameterization vector of the 3D modeled object, because it comprises the encoder, and configured to take as input a parameterization vector and to output a representation of a 3D modeled object the 3D modeled object usable in a differentiable simulation-based shape optimization, because it comprises the decoder. Furthermore, in this case, the set (resp. space) of parameterization vectors is implicitly learnt, through the learning of the encoder: the set (resp. the space) of parameterization vectors is the set (resp. the space) of vectors that the encoder is able to output after its learning. In this case, the neural network is the only output of the learning.

In any case, the neural network may be a deep neural network. The concept of Deep Neural Network is discussed in reference D. E. Rumelhart, G. E. Hinton, R. J. Williams, "*Learning internal representations by error propagation*", Parallel distributed processing: explorations in the microstructure of cognition, vol. 1: foundations, MIT Press, Cambridge, MA, 1986, which is incorporated herein by reference. Deep Neural Networks (DNNs) are a powerful set of techniques for learning in Neural Networks which is a biologically-inspired programming paradigm enabling a computer to learn from observational data. In object recognition, the success of DNNs is attributed to their ability to learn rich midlevel media representations as opposed to hand-designed low-level features (such as Zernike moments, HOG, Bag-of-Words, SIFT) used in other methods (such as min-cut, SVM, Boosting, Random Forest). More specifically, DNNs are focused on end-to-end learning based on raw data. In other words, they move away from feature engineering to a maximal extent possible, by accomplishing an end-to-end optimization starting with raw features and ending in labels.

The learning method learns a set of parameterization vectors each respective to a 3D modeled object of the training dataset. In other words, for each object of the training dataset, there is a parameterization vector. However, parameterization vectors of 3D modeled objects not belonging to the training dataset may still be obtained based on the learnt neural network at a later stage, for example during the optimization method. For example, for a 3D modeled object not belonging to the training dataset, a parameterization vector of the 3D modeled object may be obtained by a minimization (e.g., a Maximum A Posterior estimation) based on the learnt neural network, or, if the learnt neural network is an autoencoder, by applying the encoder to the 3D modeled object.

Each parameterization vector is a vector that encodes the geometry of the mechanical part represented by the corresponding respective 3D modeled object. The parameterization vector may for example encode the mechanical part's degrees of freedom that may be used to modify the shape of the mechanical part and/or any other geometrical and/or topological specification of the shape of the mechanical part. The parameterization vector may encode any number of degrees of freedom and may in particular encode a number allowing full control of the shape or, alternatively, a reduced number, for example to make shape modification more tractable or to enforce some structural constraints. The parameterization vector may be a latent vector, as known per se from the field of machine-learning. In any case, the space of the parameterization vectors has a dimension smaller than that of the space of the 3D modeled objects.

The learning further learns the neural network, which is, as previously explained, learnt to map the latent space to a space of representations of the 3D modeled object. A 3D modeled object may thus be modified by modifying its corresponding parameterization vector, which may then be mapped onto the space of the representations. For a given parameterization vector, respective to a 3D modeled object, the representation of the 3D modeled object, that the neural network is trained to output, is usable in a differentiable simulation-based shape optimization. The representation of the 3D modeled object may be any representation usable in the optimization, for example an explicit representation such as a discrete geometrical representation, or an implicit representation.

The differentiable simulation-based shape optimization is now further discussed. The following discussion on the shape optimization, the simulation and the simulator notably apply to the shape optimization, the simulation and the simulator involved in the optimization method, further discussed hereinafter.

The shape optimization, also referred to as "3D shape optimization" or simply "optimization", designates the problem of finding the shape of a 3D modeled object representing a mechanical part which is an optimal shape in that the shape minimizes a certain cost function, which is a mapping from a vector space into a scalar set or space, while satisfying one or more physical constraints. The one or more constraints forms a condition of the optimization problem, that the solution must satisfy. The one or more constraints may comprise one or more of primarily equality constraints, inequality constraints, and/or integer constraints. Shape optimization methods and algorithms may be used to analyze and improve the designs of numerous successive configurations without any help from the engineer or designer.

The shape optimization is a simulation-based optimization, i.e., the optimization uses a simulation to verify whether a candidate optimum respects the constraints. In other words, respect or non-respect of the one or more constraints is assessed by the simulation. The simulation is a physical simulation, also referred to as "physics simulation", which designates the simulation real-world physical behavior of the mechanical part based on a mathematical model of this behavior, the model modeling the state of the system at a given time. The physics simulation includes a set of one or more equations that describe how the behavior of the mechanical part evolves over time in a specific physical context, and a numerical method discretizing the set of one or more equations. Physics simulation is an engineering tool usually used in industrial design, to test manufacturing products before their actual manufacturing. For example, a simulation may be the simulation of a crash as an early step in crash testing. The physical simulation may belong to any field of physics. For example, the simulation may be one or more of a mechanical simulation, an optical simulation, and/or a thermal-dynamic simulation.

A mechanical simulation designates a simulation that simulates bodies (rigid or flexible) behavior and dynamics caused by different load conditions. Mechanical simulation is usually used to allow engineers to test, validate, and modify designs before they become a physical prototype. For instance, mechanical simulation may be used for analyzing vehicle performance in complex simulated driving environments (such as crash test or driver controls).

Optical simulation enables building optical systems by creating and placing various optical components in a physical space and simulates light propagation through the system. Example optical simulations range from optical part design such as lamps, mirrors and dashboard in the automotive industry, indoor/outdoor lighting, or cockpit analysis in the aircraft industry.

Thermodynamic simulation designates the calculation of the temporal evolution of the thermal state of a system (e.g., a mechanical part) using a numerical model of the system, which may include the temperature at a certain number of points of the elements composing the system, which evolve according to the different laws governing heat exchanges. A typical example is simulating an automotive air conditioning system by calculating the thermodynamic behavior of the whole process including the refrigeration system and passenger compartment.

The simulation uses a simulator, which is a function performing the simulation. The simulator includes the numerical method(s) and algorithm(s) that constitute the simulation. The simulator thus outputs result of the simulation. The simulation is differentiable, which means that the simulation is a differentiable function. This allows to use gradient-based numerical methods in the optimization, i.e., the optimization may implement any suitable gradient-based optimization method, such as a gradient descent algorithm. The use of a differentiable simulator notably allows back-propagation of the simulation gradient in the candidate parameterization vector during the optimization. Differentiable simulations are discussed in Yuanming Hu et al. "*DiffTaichi: Differentiable Programming for Physical Simulation*", in ICLR (2020), which is incorporated herein by reference.

The representation of a 3D modeled object that the neural network is trained to output is usable in the optimization, i.e., the representation is usable by the simulator. This does however not exclude the optimization to include a step of changing the representation into another type of representation for the purpose of the simulation. In other words, the representation may be directly usable in the simulator, or a pre-processing of the representation may be required.

The representation may be an implicit representation. The implicit representation is, as previously said, a representation of the corresponding 3D modeled object by an implicit function, defined over the 3D space where the 3D modeled object surface corresponds the isosurface of this function. That isosurface is a surface that represents points of a constant value (e.g., distance to the shape surface) within a volume of space. In other words, it is a level set of a function whose domain is a 3D-space. The implicit representation may be a signed distance field representation, i.e., the implicit function being in this case a continuous function that attributes to each point of the 3D space a signed distance to the boundary of the 3D modeled object, the signed distance being positive when the point is outside the object and negative when the point is inside. The signed distance field representation is known per se. The implicit representation allows an improved adaptability to the 3D resolution of the corresponding modeled object: the 3D resolution of the 3D modeled object represented by an input parameterization vector then decoded into the implicit representation of the 3D modeled object will be, or at least tend to be, preserved during the optimization without any further burden on the computer. The implicit representation is thus a representation that allows the optimization to manipulate 3D modeled objects with any kind of resolution. The signed distance field representation allows particularly high 3D resolutions, as the 3D modeled objects can be sampled at any resolution with this representation, using for example the 0-isosurface extraction algorithm discloses in William E. Lorensen and Harvey E. Cline, "*Marching Cubes: A High Resolution 3D Surface Construction Algorithm*", in Proceedings of the 14th Annual Conference on Computer Graphics and Interactive Techniques. SIGGRAPH '87, New York, NY, USA, which is incorporated herein by reference. Furthermore, the signed distance field representation allows to compute the normal to the surface, which may be used during the optimization for gradient computation. The representation may alternatively be an explicit representation, such as a discrete geometrical representation.

The representation is a representation of the geometry of the 3D modeled object. For example, the signed distance field representation captures the geometry of the 3D modeled object using a signed distance to its boundary. The representation may further represent the one or more physical attributes of the 3D modeled object, when the 3D modeled object includes these one or more attributes.

The learning comprises minimizing a loss. The loss penalizes, for each 3D modeled object of the dataset, a disparity between the output of the neural network for an input parameterization vector respective to the 3D modeled object and a representation of the 3D modeled object usable in a differentiable simulation-based shape optimization. The loss may be loss suitable for this training. The loss penalizes a disparity between the output of the neural network for an input candidate parameterization vector (i.e., a candidate of the optimization, a free-variable of the optimization), this output forming a candidate representation of the 3D modeled object represented by the candidate parameterization vector, and the true representation of the 3D modeled object usable in a differentiable simulation-based shape optimization (e.g., its signed distance field). In other words, the candidate parameterization vector and the weights of the neural network are the free-variables of the minimization, which modifies them as long as the value of the loss is too high, e.g., with respect to a convergence criterion. A high value of the loss means that there is a too high disparity between the candidate representation, which is the candidate output of the neural network and thus represents a candidate set of weights, and the exact representation. For example, the loss may be an increasing function of a distance between the candidate output and the exact representation. For example, the loss may be a reconstruction loss, the concept of reconstruction loss being known per se from the field of machine-learning. The loss may be referred to as "the learning loss".

As previously explained, when the neural network is an autoencoder, the candidate parameterization vector is an output of the encoder, so that in this case, the candidate parameterization vector corresponds to a candidates set of weights of the encoder. In this case the weights of the encoder and the weights of the decoder are modified during the minimization, the modification of the encoder weights indirectly modifying the candidate parameterization vector. In the case where the neural network is a decoding neural network, the candidate parameterization vector is directly a variable of the minimization and is directly modified during the minimization.

An implementation of the learning method is now discussed. This implementation may form the offline stage of the process of which flowchart is shown on FIG. 1.

Given the provided set of 3D modeled object, noted $\mathcal{M}$, this implementation automatically finds a low dimensional space that allows the parametrization of this set. Specifically, this implementation sets a number of shape's degrees of freedom D and learns the neural network, which is a DNN decoder Φ, to find the optimal D-dimensional parametrization space and the optimal Φ weights such that each 3D modeled object from $\mathcal{M}$ can be obtained by decoding its associated learned parametrization vector using Φ.

The output of the decoder in this implementation is the Signed Distance Field representation, which uses a Signed Distance Function (SDF) belonging to the field of implicit representations of 3D shapes. The SDF function is a function $f_{SDF}$:p=(x,y,z) ∈ $\mathbb{R}^3$→s∈ $\mathbb{R}$ that attributes to each point (x,y, z) its signed distance s to the boundary of the 3D modeled object. The signed distance is positive outside of the object and negative inside by convention. Thus, the SDF is zero on the object's boundary. The main upside of this representation is that the object can be sampled at any resolution if the SDF is represented by a continuous function by extracting the 0-isosruface using algorithms such as the one discussed in previously-cited reference William E. Lorensen and Harvey E. Cline, "*Marching Cubes: A High Resolution 3D Surface Construction Algorithm*", in Proceedings of the 14th Annual Conference on Computer Graphics and Interactive Techniques. SIGGRAPH '87, New York, NY, USA. Therefore, in the implementation example, 3D objects are characterized with a geometric representation.

As the provided set of 3D SDF shapes $\mathcal{M}$, this implementation uses a set of 4000 3 D CAD objects, each representing a mechanical part, from which this implementation generated their SDF values formulated for each shape O∈ $\mathcal{M}$ as a set of 3D points $p_i$ along with their signed distance to the shape surface $s_i$:

$$O = \{(p_i, s_i); p_i \in G_O\}$$

where $G_O$ is a set of regularly distributed coordinates in [—1; 1] (this is true because it is considered that shapes' geometries are centered and normalized within [−1,1]^3. Also, $G_O$ may be the same or different for the different O shapes and has a size that depends on the desired accuracy). Let $G_R$ be the grid of regularly spaced coordinates in [—1; 1] of resolution R. O is referred to as a SDF shape. This representation may be obtained using libraries such as mesh-to-sdf (https://pypi.org/project/mesh-to-sdf/) from other geometries such as meshes, or voxels.

In this implementation, the neural network is DNN decoder Φ: this implementation uses an auto-decoder architecture similar to the architecture described in Jeong Joon Park et al., "*DeepSDF: Learning Continuous Signed Distance Functions for Shape Representation*", in The IEEE Conference on Computer Vision and Pattern Recognition (CVPR), June 2019, which is incorporated herein by reference. Φ learns a continuous SDF representation of a class of shapes. Specifically, Φ learns to map a D-dimensional space $v=\{v_i\}_i \subset \mathbb{R}^D$ to shapes in $\mathcal{M}=\{O_i\}_i$. As such, for each $O=\{(p_i, s_i); p_i \in G_O\} \in \mathcal{M}$, this implementation learns Φ and $v_i \in \mathbb{R}^D$ such that $$\Phi(v_i, p_j) = s_j; \forall\, p_j \in G_O$$

The training loss in this implementation may be of the type:

$$\Phi, \{v_i\}_i = \underset{\tilde{\Phi}, \{v_i'\}_i}{\operatorname{argmin}} \sum_{O_i \in \mathcal{M}} \left( \sum_{p_j \in G_O} \left\| \tilde{\Phi}(v_i', p_j) - s_j \right\|_2^2 + \frac{1}{\sigma^2} \|v_i'\|_2^2 \right)$$

where D=256 and σ=0.01 in the implementation.

After the training phase, the outcome is a trained decoder Φ and deep parametrization space $\mathcal{V}$ such that for a given shape O represented by its SDF values (that do not necessarily belong to $\mathcal{M}$), there exists a D-dimensional vector $v \in \mathcal{V}$ such that $\Phi(v, G_R)=O$.

The optimization method is now further discussed.

The optimization method performs the differentiable simulation-based shape optimization. The optimization method comprises providing: a 3D modeled object representing a mechanical part, one or more physical constraints on the 3D modeled object, and a differentiable simulator. The differentiable simulator is the simulator performing the simulation on which the optimization is based, taking as input a representation of a 3D modeled object and outputting a value representing an extent to which the 3D modeled object respects the one or more physical constraints. The provided 3D modeled object is the input of the optimization, which is to optimize the shape of the 3D modeled object, representing the shape of the mechanical part, with respect to the one or more physical constraints. The one or more physical constraints form constraints of the optimization. The simulator is based on the geometry of its input 3D modeled object. It may also be based on a specification of one or more physical attributes of the input 3D modeled object. The input 3D modeled object, notably if it is a representation outputted by the neural network and if the objects of the training set of the neural network includes such a specification, may include the specification. If not, the simulator may compute the one or more physical attributes based on the geometry of the input.

The optimization method then comprises performing the shape optimization of the mechanical part, the shape optimization being simulation-based, i.e., being based on the provided differentiable simulator. The simulator is used by the optimization to quantify respect or non-respect of the constraints, i.e., during the optimization, respect or non-respect of the one or more physical constraints for a candidate parameterization vector is assessed using the simulator. The value outputted by the simulator evaluates the respect or non-respect of the constraints by its input.

The optimization minimizes a loss which penalizes a disparity between the value outputted by the simulator for the representation outputted by the neural network for a candidate parameterization vector (i.e., a candidate of the optimization, the parameterization vector being the free-variable of the optimization) and the optimal output of the simulator. In other words, the loss quantifies a disparity between the value representing an optimal extent to which the one or more constraints are respected (i.e., the optimal output of the simulator), and a value that represents an extent to which a candidate parameterization vector respects the constraints (i.e., the value outputted by the simulator for the output of the neural network for the candidate parameterization vector). A high value of the loss thereby means that the disparity is too high, so that the candidate parameterization vector, which represents the shape of the mechanical part to be optimized, is not optimal yet with respect to the constraints, so that another candidate vector is to be found. The minimization of the loss thereby ensures that the optimal parameterization vector (i.e., the output/result of the optimization) tends to respect the one or more physical constraints. The loss may be referred to as "the optimization loss".

The optimization thus comprises simulation steps, where for candidate parameterization vectors, the simulator is applied to the representation outputted by the neural network for these parameterization vectors. The representation may be implicit or explicit, and the simulator may take as input explicit representations. Specifically:

- the output of the neural network may be an explicit representation of the 3D modeled object parameterized by the candidate parameterization vector and the simulator may take as input an explicit representation of a 3D modeled object; or
- the output of the neural network may be an implicit representation of the 3D modeled object parameterized by the candidate parameterization vector and the simulator may take as input an explicit representation of a 3D modeled object. In this case, the performing of the simulation-based shape optimization comprising transforming (i.e., for each candidate representation vector fed as input to the loss) the implicit representation of the 3D modeled object (i.e., parameterized by the parameterization vector fed as input to the neural network) into an explicit representation.

The transforming may consist in any method for transforming an implicit representation into an explicit representation. The transforming may notably comprise extracting surface points of the 3D modeled object based on its implicit representation, for example by evaluating the implicit function on a grid of regularly spaced coordinate, sampling the points closest to the surface, and projecting them onto, thereby yielding a surface point cloud which is the explicit representation.

The loss may further penalize a disparity between a 3D modeled object parameterized by the candidate parameterization vector and the provided 3D modeled object. This allows to constraint the being-optimized parameterization vector to remain as close as possible to the input 3D modeled object while respecting the one or more physical constraints. In other words, the optimization tends to optimize the shape of the mechanical part with respects to the one or more constraints but without modifying, as far as possible, the initial shape of the mechanical part to a large extent.

The disparity between the 3D modeled object parameterized by the candidate parameterization vector and the 3D modeled object may comprise a disparity between the candidate parameterization vector and a parameterization vector of the provided 3D modeled object. The parameterization vector of the provided 3D model object is obtained from the 3D modeled object. The optimization method may thus comprise a step of obtaining this parameterization vector. This step may comprise applying an encoder of the neural network to the 3D modeled object, when the neural network is an autoencoder. Alternatively, when the neural network is a decoding neural network as previously discussed, this step may comprise extracting the parameterization vector by an optimization performed on the learnt neural network, e.g., by computing a Maximum-a-Posterior (MAP) estimation as follows:

$$v = \arg\min_{v'} \sum_{(p_j, s_j) \in O} \left\| \Phi(v', p_j) - s_j \right\|_2^2 + \frac{1}{\sigma^2} \|v'\|_2^2,$$

where ν is the parameterization vector, where $\Phi(\nu', p_j)$ is the output of the neural network for a candidate vector ν' of the optimization, where O is the provided 3D modeled object, where $(p_1, s_1) \in O$ represents samples of the representation of O. The term $$\frac{1}{\sigma^2} \|v'\|_2^2$$

is optional and may be absent from the formula.

This disparity allows to prevent, as far as possible, the optimized mechanical part to have a shape departing from its initial shape in a too large extend, by controlling the shape modification using the parameterization vector. Additionally or alternatively, the disparity between the 3D modeled object parameterized by the candidate parameterization vector and the 3D modeled object may comprise a disparity between the output of the neural network for the candidate parameterization vector and a representation of the provided 3D modeled object. This allows to prevent, as far as possible, the optimized mechanical part to have a shape departing from its initial shape in a too large extend, by controlling the shape modification using the representation of the 3D modeled object representing the mechanical part. The optimization method may thus contemplate two different disparities for avoiding, as far as possible, shape modification in a too large extent. Using both disparities improves robustness.

The loss may be of the type:

$$d_{\mathbb{R}}(\Psi_0 \Phi(v', \mathcal{G}_R), f_{opt}) + \alpha\, d_{\mathbb{R}^D}(v, v') + \beta\, d_S(\Phi(v', \mathcal{G}_R), O),$$

where $\Phi(\nu', \mathcal{G}_R)$ is the output of the neural network 4) for the candidate parameterization vector ν', Ψ is the simulator, $f_{opt}$ is the optimal output of the simulation with respect to the one or more physical constraints, ν is the parameterization vector of the provided 3D modeled object, $O=\Phi(\nu, \mathcal{G}_R)$ is the representation of the provided 3D modeled object, $d_{\mathbb{R}}$, $d_{\mathbb{R}^D}$, $d_S$ are distances, and a and β are coefficients of the loss.

The optimization method may comprise, prior to the minimization of the loss, a step of extracting a parameterization vector of the provided 3D modeled object. The extraction may comprise a selection of the parameterization vector based on the learnt neural network. For example, if the learnt neural network is an autoencoder, the extracting may comprise applying the encoder to the provided 3D modeled object to obtain its parameterization vector. If the learnt neural network is a decoding neural network, the extracting may comprise finding the parameterization vector with an optimization based on the learnt decoding neural network, the optimization including for example computing a Maximum-A-Posterior (MAP) estimation.

When the output of the neural network for an input candidate parameterization vector is an implicit representation of the 3D modeled object parametrized the input parameterization vector, the implicit representation being a signed distance field, and the simulator takes as input an explicit representation of a 3D modeled object, the distance $d_S$ may be of the type:

$$d_S(\Phi(v_1, \mathcal{G}_R), \Phi(v_2, \mathcal{G}_R)) = BCE\left(B^{\sigma}(v_2), B^{\mathbb{I}}(v_1)\right),$$

where for i=1, 2, $\nu_i$ is a parameterization vector, $\Phi(\nu_i, \mathcal{G}_R)$ is the output of the neural network for the parameterization vector $\nu_i$, Φ being the neural network, where $$B^{\mathbb{I}}(v) = \{\mathbb{I}_{\Phi(v,x)<0};\, x \in \mathcal{G}_R\},$$

$$B^{\sigma}(v) = \left\{\sigma\left(\eta^{\Phi}(v, x)\right);\, x \in \mathcal{G}_R\right\},$$

η being a negative real number, $\mathbb{I}$ and σ being respectively the indicator and the sigmoid functions, $\mathcal{G}_R$ being a grid of regularly spaced coordinates, and where BCE is a binary cross entropy distance between two sets X and $\mathcal{Y}$ with size n such as $\forall x \in X \cup \mathcal{Y}$, $x \in [0, 1]$ and is given by the formula $$BCE(X, \mathcal{Y}) = \frac{1}{n} \sum_{i=1}^{n} y_i \log(x_i) + (1 - y_i) \log(1 - x_i),$$

where the $x_i$ are the points of X and where the $y_i$ are the points of $\mathcal{Y}$.

An implementation of the optimization method is now discussed. This implementation may form the online stage of the process of which flowchart is shown on FIG. 1. This implementation contemplates a dropping simulation and an optimization of the physical stability of a mechanical part. It is to be understood that this particular simulation and this particular optimization only form an example which illustrates the implementation. Other examples of simulations and optimization problems may be contemplated by the optimization.

Industrial 3D shapes are often expected to satisfy a particular behavior in the physical world as rotational dynamics, fluid dynamics or resistance to external force load to name few. This behavior may be quantified using physical simulation tools that evaluates within a relevant context to which extent the simulated 3D shape meets the expected physical behavior. This evaluation relies on comparing the physical simulation output formulated for instance as a 3D trajectory, volume deformation, or heat distribution, to an optimal physical simulation output usually fixed by Terms of Service for industrial shapes.

This implementation belongs within this context. Given a 3D modeled object O that represents a mechanical part that violates a pre-defined physical behavior, this implementation carries out an optimization schema that outputs another 3D modeled object $O_{opt}$ verifying the said physical behavior while remaining similar to the original modeled object O.

This implementation shifts this simulation-based physical optimization problem from the space of 3D modeled object into a lower dimensional space automatically learned. Therefore, the former formulation may be equivalently written by replacing O by ν such that $\Phi(\nu, G_R)=O$. Besides making the problem more computationally tractable since this implementation simplifies the search space while obeying exact simulation constraint, it also yields advantages related to preserving shape structure, as further explained hereinafter.

This implementation adopts the modeling that the physical behavior of object O is quantified by a value $f \in \mathbb{R}$. $f$ may be multi-dimensional, and in such cases, it suffices to apply an aggregation formula to $f$ such as Euclidean norm to obtain a scalar). Let $f_{opt} \in \mathbb{R}$ be the target (optimal) physical behavior value that O is to achieve, and let $\Psi$ be the physical simulator, so $\Psi(O)=f$. Consequently, the optimization problem may be expressed as finding $v_{opt}$ such that:

$$v_{opt} = \arg\min_{v'} d_{\mathbb{R}}(\Psi_O \Phi(v'), f_{opt}) + \alpha\, d_{\mathbb{R}^D}(v, v') + \beta d_S(O, \Phi(v'))$$

where $d_{\mathbb{R}}$ and $d_{\mathbb{R}^D}$ are distance functions in $\mathbb{R}$ and $\mathbb{R}^D$ respectively (Euclidean distance for instance) and $d_S$ is a distance function in the spatial space that measures the similarity between the spatial layout of two 3D modeled objects. $d_S$ depends on the 3D shape representation. $\alpha$ and $\beta$ are two weighting positive scalar coefficient, that are for example determined by the user. While the last two terms of the objective function promote the similarity to the input modeled object O, the first one encourages shape variations that enforce the respect of the target physical behavior quantified by $f_{opt}$.

The implementation extracts a parametrization vector $v$ for the provided 3D modeled object O by computing a Maximum-a-Posterior (MAP) estimation as follows:

$$v = \underset{v'}{\operatorname{argmin}} \sum_{(p_j, s_j) \in O} \|\Phi(v', p_j) - s_j\|_2^2 + \frac{1}{\sigma^2}\|v'\|_2^2.$$

This formulation is valid for SDF shapes O of arbitrary size and distribution because the gradient of the loss with respect to $v$ may be computed separately for each SDF sample ($p_j$, $s_j$). This implies that $\Phi$ may handle any form or sampling of SDF values. Note that SDF shapes may be obtained from any representation such as mesh, voxel. This makes the implementation generalizable to any input representation.

Figure 2:
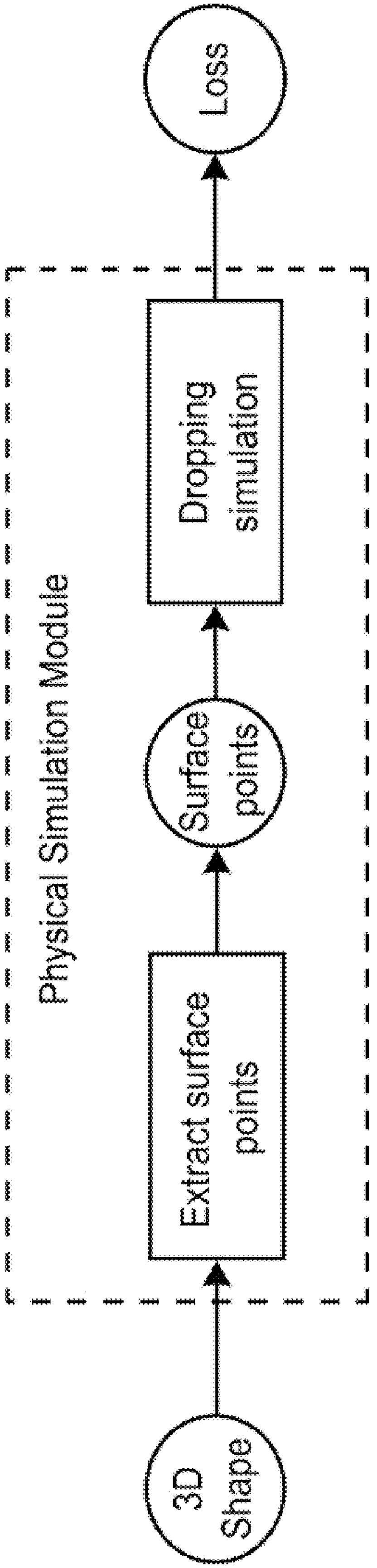

This implementation uses a simulator, also referred to as "physical simulation module", $\Psi$ that takes as input an SDF representation of a 3D modeled object O and produces its physical behavior value $f$: $\Psi(O)=f$. As illustrated on FIG. 2, showing a schematic representation of the simulator, $\Psi$ consists of two steps (1) Extract surface points: the implementation identifies the shape surface of O to enable physical assessment of O and (2) Dropping simulation simulates the physical behavior of O represented by its surface points and returns the loss function value is to be minimized (the difference between $f$ and $f_{opt}$).

The Extract surface point step proceeds as follows. As stated earlier, $\Psi$ produces shapes represented as signed distance field SDF formulated by a function that attributes to each three dimensional point its signed distance to the surface, where this distance is positive if the point is outside the shape surface and negative otherwise. $\Phi$ is a differentiable function of the type:

$$\Phi : (v; x) \in \mathbb{R}^D \times \mathbb{R}^3 \mapsto s \in \mathbb{R}$$

with $v$ the parametrization vector, x the point coordinates and s the signed distance to the surface of the object. Let $\nabla\Phi_v$: $\mathbb{R}^{D}* \to \mathbb{R}^D$ and $\nabla\Phi_x$: $\mathbb{R}^3 \to \mathbb{R}^3$ be its gradients with respect to the parametrization vector $v$ and the point coordinates x.

The extracting according to this implementation obtains a point cloud of the surface of the object, by evaluating $\Phi$ on the grid of regularly spaced coordinates $G_R$ of size R. The resulting set of grid coordinates is noted:

$$G_R = \{x_1; \ldots ; x_{R^3}\}.$$

To obtain the point cloud of the surface, this implementation evaluates the signed distance of all points in $G_R$. Let:

$$S(v) = \{s_1; \ldots ; s_{R^3}\} = \{\Phi(v; x_1); \ldots ; \Phi(v, x_{R^3})\},$$

be the resulting signed distances. Using the grid of signed distances, this implementation samples the points closest to the surface in order to obtain the surface point cloud.

In this approach, the gradient $\nabla\Phi_x$ is leveraged to project the points near the surface onto it. The sampled point cloud may be written as:

$$C(v) = \left\{x - \Phi(v, x)\frac{\nabla\Phi_x(v, x)}{\|\nabla\Phi_x(v, x)\|}; |\Phi(v, x)| < s_{max}, x \in G_R\right\}$$

$$\text{with } s_{max} = \frac{\sqrt{3}}{2R}.$$

The idea here is quite simple: since the distance and the direction to the surface from any point in space are known thanks to $\Phi$ being differentiable with respect to x, this implementation has everything needed to adjust the point coordinates towards the object's surface.

The dropping simulation proceeds as follows. It implements a physical simulation process, based on: a description of shapes and their variations (e.g., as sets of parameters or density functions), a physical simulation algorithm, for instance based on PDE (e.g., the linear elasticity equations or Stokes system), for describing the mechanical behavior of mechanical parts, and a numerical description of physical behavior (e.g., the part volume or position).

3D modeled objects, that represent mechanical parts, are described by their surface points extracted as previously explained. 100 points are sampled for the simulation using farthest point sampling. They may vary in the 3D space.

The physical simulation model is designed to quantify the physical stability of the 3D shape. Note that physical stability depends on the geometric representation learned by the deep decoder D. To this end, this implementation implements a rigid body dynamics model that simulates the dropping of the 3D shape when subjected to gravity and to trivial perturbation forces. The model may be implemented using the framework of previously-cited reference Yuanming Hu et al, "*DiffTaichi: Differentiable Programming for Physical Simulation*", in ICLR (2020).

According to Euler's First Law, the sum of the external forces F on a system of particles (or rigid body) equals the sum of mass and acceleration of all its particles. As such, if x is the center of mass of the system, and m its total mass, then:

$$F = m\frac{d^2x}{dt^2}.$$

In addition, Euler's Second Law specifies the rotational dynamics of a rigid body. With L the angular momentum and $\tau$ the torques applied to the object, then:

$$\tau = \frac{dL(t)}{dt}$$

such that $L=I(t)\omega(t)$ with $I(t)$ the inertia matrix and $\omega(t)$ the angular velocity at time t.

In order to simulate the linear and rotation dynamics of a rigid object, this implementation the numerical integration approach described in references David Baraff, "*An Introduction to Physically Based Modeling* (*I*)", en, in SIGGRAPH, (1997), p. 32, and David Baraff, "*An Introduction to Physically Based Modeling* (*II*)", en, in SIGGRAPH (1997), p. 38, which are both incorporated herein by reference, this approach being based on the first order Euler algorithm discussed in Kendall E Atkinson, "*An Introduction to Numerical Analysis*", John Wiley & sons, 2008, which is incorporated herein by reference.

For any simulation time step $t \in \{0, 1, \ldots T\}$, the system of mass m is described by the following variables:

- $x_t \in \mathbb{R}^3$: position of the center of mass
- $v_t \in \mathbb{R}^3$: velocity of the center of mass
- $R_t \in \mathbb{R}^{3\times3}$: rotation matrix
- $I_t \in \mathbb{R}^{3\times3}$: inertia matrix
- $L_t \in \mathbb{R}^3$: angular momentum
- $\omega_t \in \mathbb{R}^3$: rotational velocity
- $q_t \in \mathbb{R}^4$: quaternion representing the object's orientation more efficiently.

Indeed, since the quaternion is on the unit sphere, it can be normalized throughout the simulation, which prevent numerical drift as discussed in previously-cited references David Baraff, "*An Introduction to Physically Based Modeling* (*I*)", en, in SIGGRAPH, (1997), p. 32, and David Baraff, "*An Introduction to Physically Based Modeling* (*II*)", en, in SIGGRAPH (1997), p. 38.

Furthermore, the resultants of all forces and torques applied to the system are respectively noted $F_t$ and $\tau_t$ for each simulation time step t.

This implementation also computes three physical properties of the object that will allow to simulate its dynamics: mass, center of mass and matrix of inertia; $\Psi(v)=(m, G, I_0$. All three items are computed from a point cloud sampled inside the object, noted:

$$C_{inside}(z) = \{x \in G_R;\ \Phi(v, x) < 0\}$$

Let $n_{in}$ be the size of $\mathcal{C}_{inside}(z)$ and $m_p$ the mass of a single point of the grid $G_R$. According to previously-cited references David Baraff, "*An Introduction to Physically Based Modeling* (*I*)", en, in SIGGRAPH, (1997), p. 32, and David Baraff, "*An Introduction to Physically Based Modeling* (*II*)", en, in SIGGRAPH (1997), p. 38, $$m = n_{in} m_p$$

$$G = \frac{1}{n_{in}} \sum_{x \in C_{inside}(z)} x$$

$$I_0 = m_p\left[r(x)r(x)^T \mathbb{I}_{3\times3} - r(x)^T r(x)\right]$$

with $r(x)=x-G \in \mathbb{R}^{1\times3}$ and $\mathbb{I}_{3\times3}$ the identity matrix.

Supposing the initial state of all variables known, the numerical integration of Euler's laws yields the algorithm described in previously-cited reference "*An Introduction to Numerical Analysis*", John Wiley & sons, 2008.

To account for contacts between the object and its environment or other objects, a contact model is used. Contact models may be divided into two families: colliding contact and resting contact. Colliding contact occurs when two bodies are in contact at some point p and with a non-zero relative velocity towards each other. Resting contact is the opposite: the two bodies are in contact but without velocity.

The impulse-based approach described in previously-cited references David Baraff, "*An Introduction to Physically Based Modeling* (*I*)", en, in SIGGRAPH, (1997), p. 32, and David Baraff, "*An Introduction to Physically Based Modeling* (*II*)", en, in SIGGRAPH (1997), p. 38, is used as contact model. This implementation focuses on contacts between a rigid body and a plane (floor for example), but could be extended to contacts with other rigid bodies with a simple geometry. To model resting contact, this implementation proceeds with computing the resulting impulse at each contact point. To this end, information about all the other contact points in order to balance the object is used. As such, all impulses have to be determined at the same time. Consequently, this type of contact cannot leverage parallel computations. For this reason, this implementation approximates it as in the examples provided in the Taichi repository (to be found on https://github.com/yuanming-hu/difftaichi) by assuming a colliding contact at each contact point and computing the resulting impulse as the average of all impulses.

The first step is to detect when a collision occurs between the floor and the object. A contact point at time t is noted $\mathcal{C}_t \subset \mathbb{R}^{n_\mathcal{C}\times3}$ of size $n_\mathcal{C}$. The floor is a plane $\mathcal{P}$ described by its normal $\hat{n}$ (oriented upwards by convention) and an offset c.

For any point $p \in \mathcal{C}_t$ its signed distance to the plane $\mathcal{P}$ may be computed as:

$$d_\mathcal{P}(p) = \hat{n} \cdot p - c$$

A collision occurs with at point p of the object whenever $d_\mathcal{P}$ <0. Let $\mathcal{A}_t$ be the set of contact points at time t.

In practice, collisions are detected with an approximation of the point coordinates at time t+1, noted $$\widetilde{\mathcal{A}_{t+1}} = \{p \in \mathcal{A}_t, d_\mathcal{P}(p + v_p\ \Delta\ t) < 0\}$$

with $v_p$ the velocity of point p at time t.

When a collision is detected, an instantaneous change in velocity is required. To do so, a new quantity J called an impulse is used. Applying an impulse to an object produces an instantaneous change in the velocity of the body. In the end, the contact point $p \in \tilde{\mathcal{A}}_{t+1}$ induces an impulse $J_p$, defined as:

$$J_p = j_{normal}\hat{n} + j_{tangent}\hat{t}$$

computed as described in previously-cited references David Baraff, "*An Introduction to Physically Based Modeling* (*I*)", en, in SIGGRAPH, (1997), p. 32, and David Baraff, "*An Introduction to Physically Based Modeling* (*II*)", en, in SIGGRAPH (1997), p. 38. Consequently, the object is subject to a global impulse $J_t$ and torque $$\tau_t^J$$

at time t such that:

$$J_t = \frac{\sum_{p\in\tilde{\mathcal{A}}_{t+1}} J_p}{\max(1, \#\tilde{\mathcal{A}}_{t+1})}$$

$$\tau_t^J = \frac{\sum_{p\in\tilde{\mathcal{A}}_{t+1}} (p - x_M) \times J_p}{\max(1, \#\tilde{\mathcal{A}}_{t+1})}$$

The simulation algorithm is described by Algorithm 1 below:

Algorithm 1 First order numerical integration of Euler's laws with constraints

Require: $x_0$, $v_0$, $L_0$, $I_0$, $\omega_0$, $q_0$, $R_0$
for t ← 1 to T do
procedure COLLISION HANDLING
for p ∈ $\tilde{A}_{t+1}$ do $$J_p \leftarrow j_{normal}(p)\ \hat{n} + j_{tangent}(p)\hat{t}$$

end for $$J_t \leftarrow \frac{\sum_{p\in\tilde{A}_{j+i}} J_p}{\max(1, \#\tilde{A}_{t+1})}$$

$$\tau_t^j \leftarrow \frac{\sum_{p\in\tilde{A}_{t+i}} (p - x_M) \times J_p}{\max(1, \#(\tilde{A})_{t+1})}$$

end procedure
procedure LINEAR DYNAMICS $$v_t \leftarrow v_{t-1} + \frac{1}{m}(\Delta t\, F_t + J_t)$$

$$x_1 \leftarrow x_{t-1} + \Delta t\, v_t$$

end procedure
procedure ROTATIONAL DYNAMICS $$L_t \leftarrow L_{t-1} + \Delta t(\tau_i + \tau_t^J)$$

$$I_t^{-1} \leftarrow R_{t-1} I_0^{-1} R_{t-1}^T$$

$$\omega_t \leftarrow I_t^{-1} L_t$$

$$g_t' \leftarrow q_{t-1} + \frac{\Delta t}{2} < q_{t-1}, [0, \omega_t] >_{quat}$$

$$q_t \leftarrow \frac{q_t'}{\|q_t'\|}$$

-continued

Algorithm 1 First order numerical integration of Euler's laws with constraints $$R_t \leftarrow quat2rot(q_t)$$

end procedure
end for

The symbol $\langle \ldots \rangle_{quat}$ denotes the quaternion multiplication. A quaternion $q = s + v_x i + v_y j + v_z k$ can be noted as the pair [s, v], with $s \in \mathbb{R}$ and $v \in \mathbb{R}^3$.

The quaternion multiplication is defined as:

$$\langle [s_1, v_1], [s_2, v_2] \rangle_{quat} = [s_1\ s_2 - v_1 \cdot v_2, s_1 v_2 + s_2\ v_1 + v_1 \times v_2]$$

with x denoting the cross product between two 3D vectors. The routine quat2rot transforms the quaternion representation to a rotation matrix.

Figure 3:
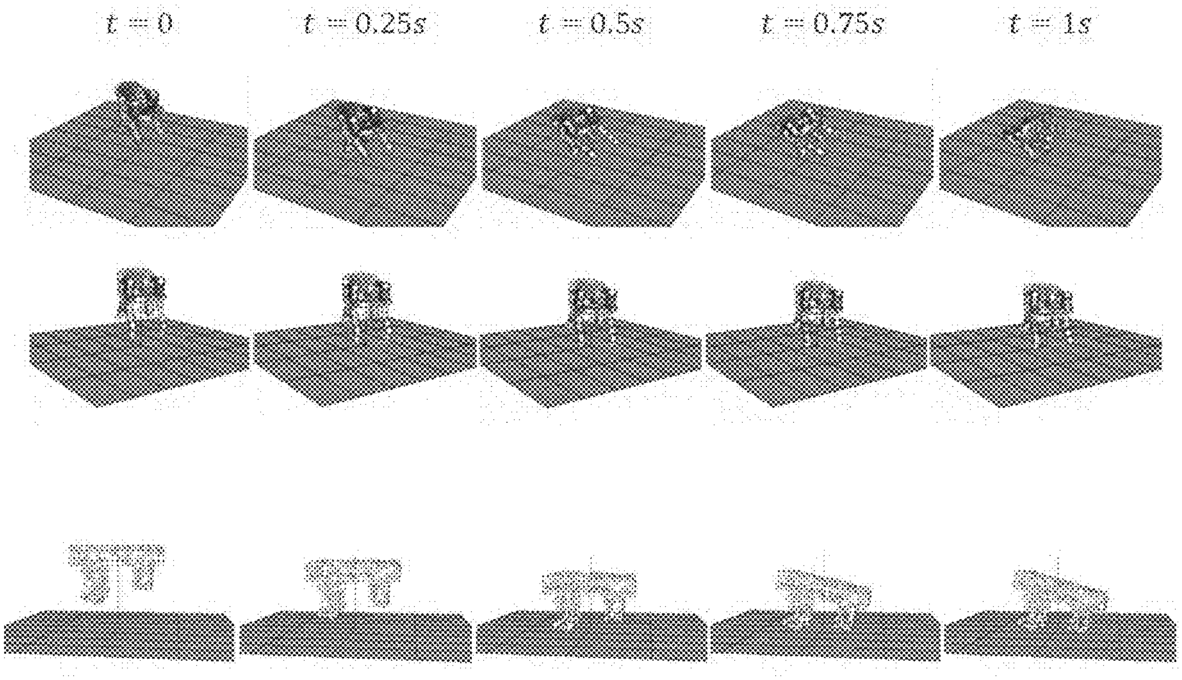

FIG. 3 shows an illustration of two dropping simulation: unstable shape (top and bottom rows) and stable shape (middle row).

The rotation matrix is used to determine how upright the object is at the end of the dropping simulation. For all $t \in \{0, \ldots, T\}$, the rotation matrix is noted:

$$R_t = \begin{bmatrix} r_{0,0}^t & r_{0,1}^t & r_{0,2}^t \\ r_{1,0}^t & r_{1,1}^t & r_{1,2}^t \\ r_{2,0}^t & r_{2,1}^t & r_{2,2}^t \end{bmatrix}$$

with $$r_{i,j}^t \in [-1, 1], \forall (i, j) \in \{0, 1, 2\}^2.$$

At the initial state (without initial orientation), $$R_0 = \begin{bmatrix} 1 & 0 & 0 \\ 0 & 1 & 0 \\ 0 & 0 & 1 \end{bmatrix}$$

Since the object is to be in an upright position at the end of the simulation, the physical behavior quantity $f$ for stability assessment is:

$$f_{stability}(\mathcal{C}, \psi) = 1 - r_{2,2}^T$$

with $\mathcal{C}$ the initial surface point cloud and $\psi = (m, G, I_0)$ the object properties (mass, center of mass, inertia matrix).

The optimization problem is, as previously discussed, $$v_{opt} = \text{argmin}_{v'}\, d_{\mathbb{R}}(\Psi o \Phi(v', \mathcal{G}_R), f_{opt}) + \alpha d_{\mathbb{R}^D}(v, v') + \beta\, d_s(\Phi(v', \mathcal{G}_R), O)$$

$d_S$ is the distance between $\Phi(v, \mathcal{G}_R)$ and $\Phi(v', \mathcal{G}_R)$ is defined as follows:

$$d_S(\Phi(v, \mathcal{G}_R), \Phi(v', \mathcal{G}_R)) = BCE(B^{\sigma}(v_2), B^{\mathbb{I}}(v_1))$$

with $B^{\mathbb{I}}(v)$ and $B^{\sigma}(v)$ are function defined as the following:

$$B^{\mathbb{I}}(v) = \{\mathbb{I}_{\Phi(v,x)<0}; x \in \mathcal{G}_R\}$$

$$B^{\sigma}(v) = \{\sigma(\eta\ \Phi(v, x)); x \in \mathcal{G}_R\}, \eta = 1000$$

$\eta=-1000$ where $\mathbb{I}$ and $\sigma$ are respectively the indicator and the sigmoid functions.

The binary cross-entropy BCE between two sets X and $\mathcal{Y}$ with size n such as $\forall x \in X \cup \mathcal{Y}$, $x \in [0, 1]$ is defined as:

$$BCE(X, \mathcal{Y}) = \frac{1}{n}\sum_{i=1}^{n} y_i \log(x_i) + (1 - y_i)\log(1 - x_i).$$

This distance is commonly used to train deep learning models and is differentiable. The value of $\eta$ is chosen manually to offer the desired result.

$\Psi_O\Phi$ is also differentiable with respect to v since both functions $\Psi$ and $\Phi$ are differentiable. Now it remains to compute $\nabla_v\Psi_O\Phi$ so that $v_{opt}$ can be obtained using classical gradient-based optimization approaches.

Since the simulation model is differentiable, $\nabla_{\mathcal{C}} f_{stability}$ is well defined. $\nabla_v f_{stability}$ is defined as follows:

$$\nabla_v f_{stability} = \frac{\partial f_{stability}}{\partial v} = \frac{\partial f_{stability}}{\partial SDF}\frac{\partial SDF}{\partial v} = \frac{\partial f_{stability}}{\partial SDF}\nabla_v \Phi$$

$\nabla_v\Phi$ is well defined since $\Phi$ is a DNN. Only $$\frac{\partial f_{stability}}{\partial SDF}$$

is to be computed.

Computing $$\frac{\partial f_{stability}}{\partial SDF}$$

boils down to estimating now SDF should be modified to shift the $f_{stability}$ value in the optimal direction (minimize $f_{stability}$ in the present case since the shape is to be stabilized). Thereby, from now on this quantity is written $\delta$SDF.

The set of surface points $\mathcal{C}$ may be written as:

$$\mathcal{C} = \{p_1, \ldots, p_{n_{\mathcal{C}}}\}, p_i \in \mathbb{R}^3$$

with $n_{\mathcal{C}}$ the size of the surface point cloud $\mathcal{C}$. The corresponding functional gradient may also be written as:

$$\nabla_{\mathcal{C}} f_{stability}(\mathcal{C}, \psi) = \{g_1 \ldots g_{n_{\mathcal{C}}}\}, p_i \in \mathbb{R}^3.$$

The functional gradient yields information about how the coordinates of each point of the surface should change so as to increase or decrease the functional score. To know how the SDF values of the surface points should change accordingly, i.e., to know $\delta$SDF, the gradients $\nabla\phi(z, x)$ are used:

$$\mathcal{D}(z) = \{\nabla\phi(z, x) = [\nabla_z\phi(z, x), \nabla_x\phi(z, x)]; x \in \mathcal{G}_R\}.$$

The change of SDF values at any point of the grid $x \in \mathcal{G}_R$ is:

$$\delta_{SDF}(x) = -\langle\nabla_x\phi(v, x), g(x)\rangle \in \mathbb{R}.$$

Figure 4:
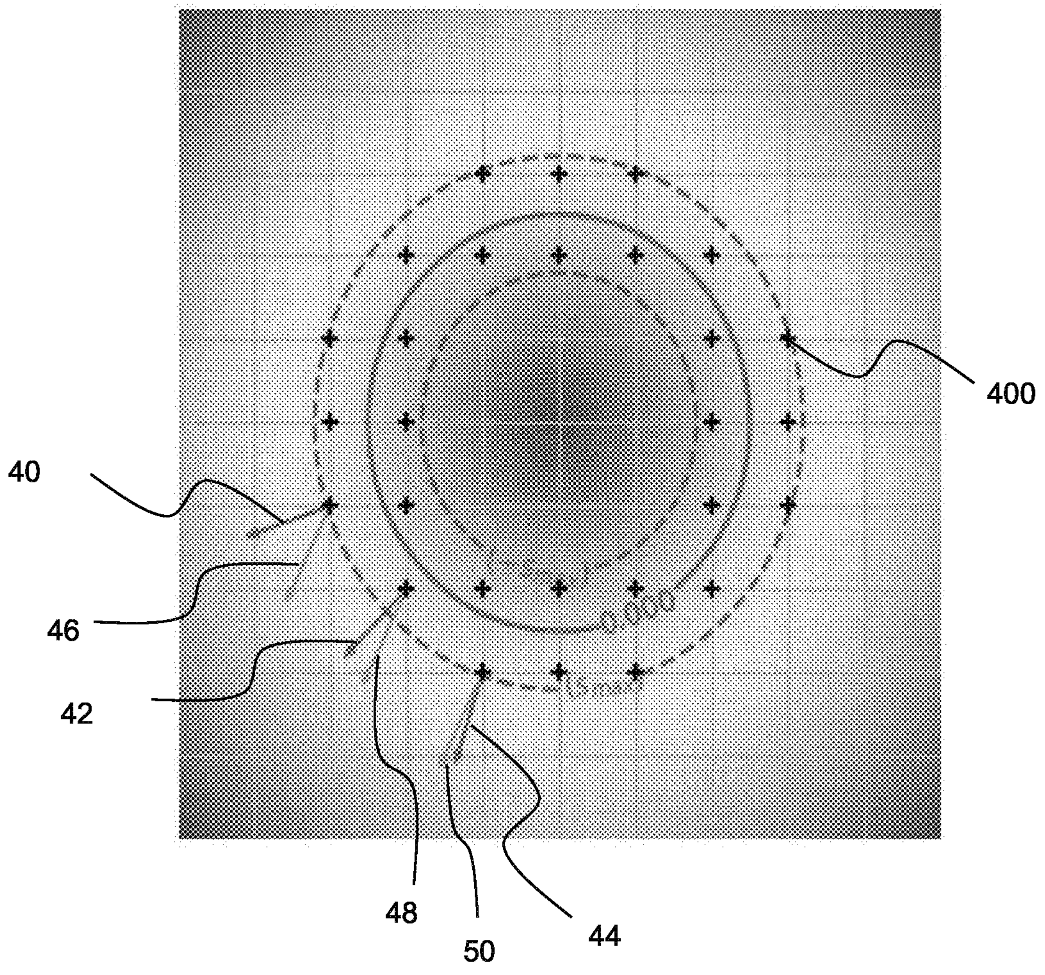

FIG. 4 illustrates the concepts of surface point cloud C $\mathcal{C}_{regular}$ (z) (illustrated by crosses, for example cross 400), SDF gradients $\nabla_x\phi$ (illustrated by arrows 40, 42 and 44), functional gradients $\nabla_{\mathcal{C}} f_{stability}$. (illustrated by arrows 46, 48 and 50). FIG. 4 illustrates the SDF and simulation gradients that are used to compute the previously-discussed change of SDF values at any point. For the sake of understandability, the illustration of FIG. 4 features a surface point cloud obtained with regular sampling. However, the same expression applies for projected sampling (projecting point near the surface onto the surface as previously discussed). For the surface to move in the direction indicated by the functional gradients (green), the SDF values of active points should change according to the equation describing $\delta_{SDF}$ (the SDF values of all active points should decrease).

Finally, $v_{opt}$ may be estimated by solving the optimization problem (i.e., minimizing the optimization loss) using a gradient-based approach, for example the gradient descent algorithm.

As previously explained, the process of which flowchart is shown on FIG. 1 may comprise, as the offline stage, the previously-discussed implementation of the learning method, and as the online stage, the previously-discussed implementation of the optimization method.

The offline stage aims at training a deep decoder using a set of 3D objects. It consists of a DNN-based model. 3D objects are characterized with one or more geometry representations and/or attributes. The deep decoder learns a parametrization (latent) vectors and a mapping function that maps the parametrization vectors to the 3D object characterization space.

The online stage, given a 3D shape to optimize with respect to a physical simulation constraint, proceeds with the following steps:

1) Identify the input parametrization vector that produces the input shape when decoded using the deep decoder.
2) Implement the physical simulation constraint. The physical simulation constraint depends on the 3D objects characterization geometry representations and/or attributes given to learn the deep decoder at the offline stage. In other words, to meet the physical simulation constraint, it is sufficient to modify the provided characterization geometry representations and/or attributes.

3) Optimize the input parametrization vector into an output parametrization one that produces a corrected version.

The process illustrated by FIG. 1 thus proposes a learning-based parametrization of a class of complex 3D shapes for the task of 3D shape optimization through physical simulation. This process offers the following:

simulation-based 3D shape optimization using an automatically learned parametrization from a set of 3D objects is performed;

allowing an automatic (learned) low dimensional parametrization of complex shapes;

guaranteeing relevant object variations with respect to real world objects to meet the simulation-based constraint. This is due to the fact that the search space is shifted to the learned parametrization space that embeds knowledge about the object category;

allowing the handling of complex optimization tasks (complex shapes and complex shape variations) compared to existing methods;

efficient method to back-propagate the simulation gradient to the parametrization vector is proposed, allowing the use of fast gradient-based methods to optimize the input object.

Figure 5:
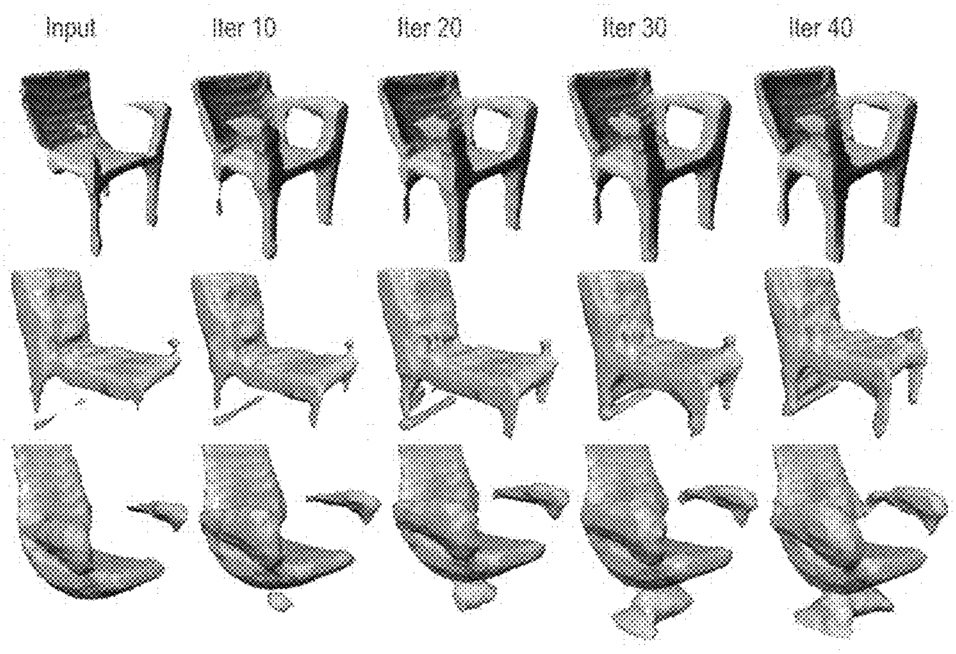

FIG. 5 illustrates several shape optimizations of chairs to improve their stability obtained with the process of which flowchart is shown on FIG. 1.

Figure 6:
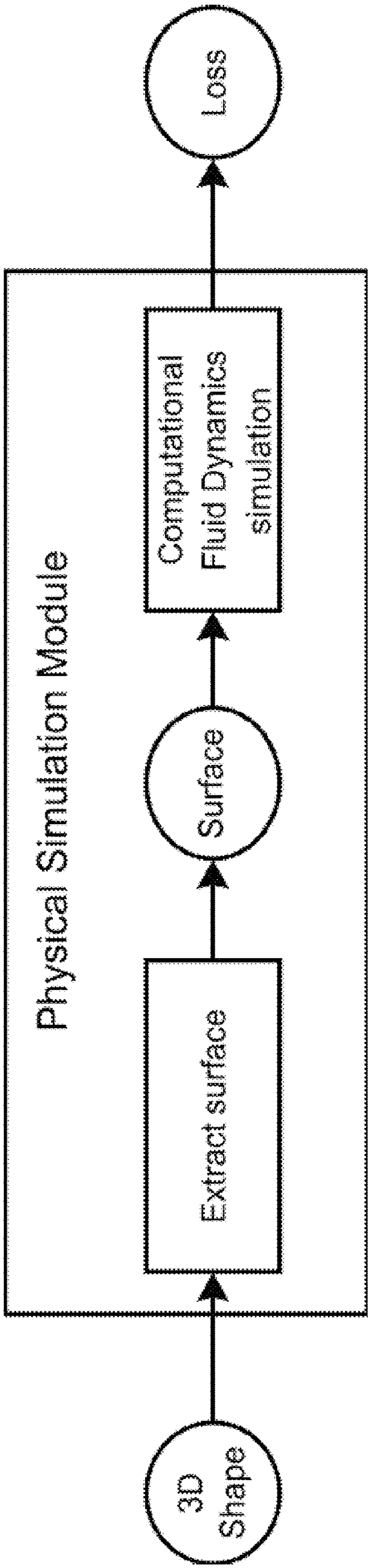

As previously said, this implementation may perform other types of optimization. For example, this implementation may perform a drag minimization for cars objects, as discussed for example in reference E. Remelli et. al., "*MeshSDF: Differentiable Iso-Surface Extraction*", in *Advances in Neural Information Processing Systems,* 2020, which is incorporated herein by reference. This implementation may for that use the same settings as previously discussed while replacing the physical simulation module shown in FIG. 2 by that shown in FIG. 6, where:

Extract surface: employs Marching Cubes algorithm that outputs a mesh S from $\Phi(v', G_R)$; and Computational Fluid Dynamics simulator that takes as input S and computes the pressure field.

The physical behavior quantity $f_{aerodynamic}$ for aerodynamic assessment is similar to the one in previously-cited reference E. Remelli et. al., "*MeshSDF: Differentiable Iso-Surface Extraction*", in *Advances in Neural Information Processing Systems,* 2020:

$$\Psi_O \Phi(v', G_R) = f_{aerodynamic} = \iint_S pndS$$

where the integral term approximates drag given the predicted pressure field p and n denotes the projection of surface normals along airflow direction. Here $f_{opt}=0$.

The implementation may contemplate other optimization examples, such as the optimization problems illustrated by FIG. 5 in previously-cited reference E. Remelli et. al., "*MeshSDF: Differentiable Iso-Surface Extraction*", in *Advances in Neural Information Processing Systems,* 2020. However, the optimization method does not use a learned surrogate model to imitate the simulation, but rather directly integrates the simulation process. The simulation provided by the optimization method is hence more accurate and does not depend on the learning data (i.e., is generalizable).

Figures illustrating the previously-discussed implementations are now presented.

Figure 7:
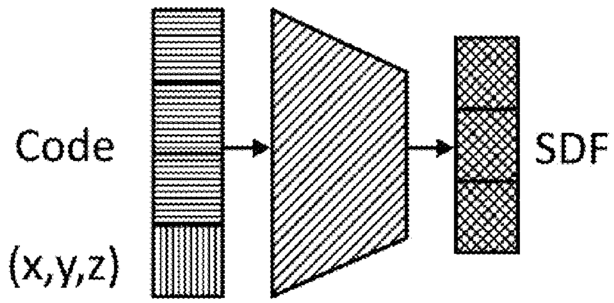
Figure 8:
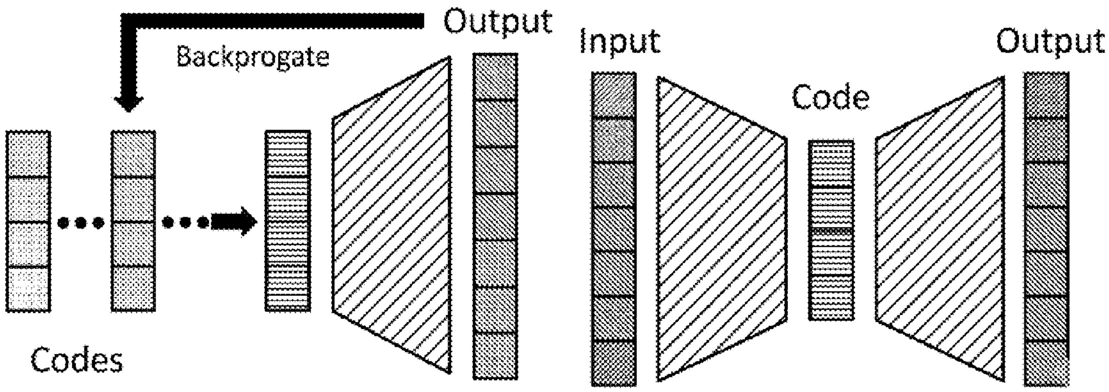

FIG. 7 illustrates the neural network, where the neural network is a decoding neural network. FIG. 8 illustrates the neural network, where the neural network is an autoencoder.

Figure 9:
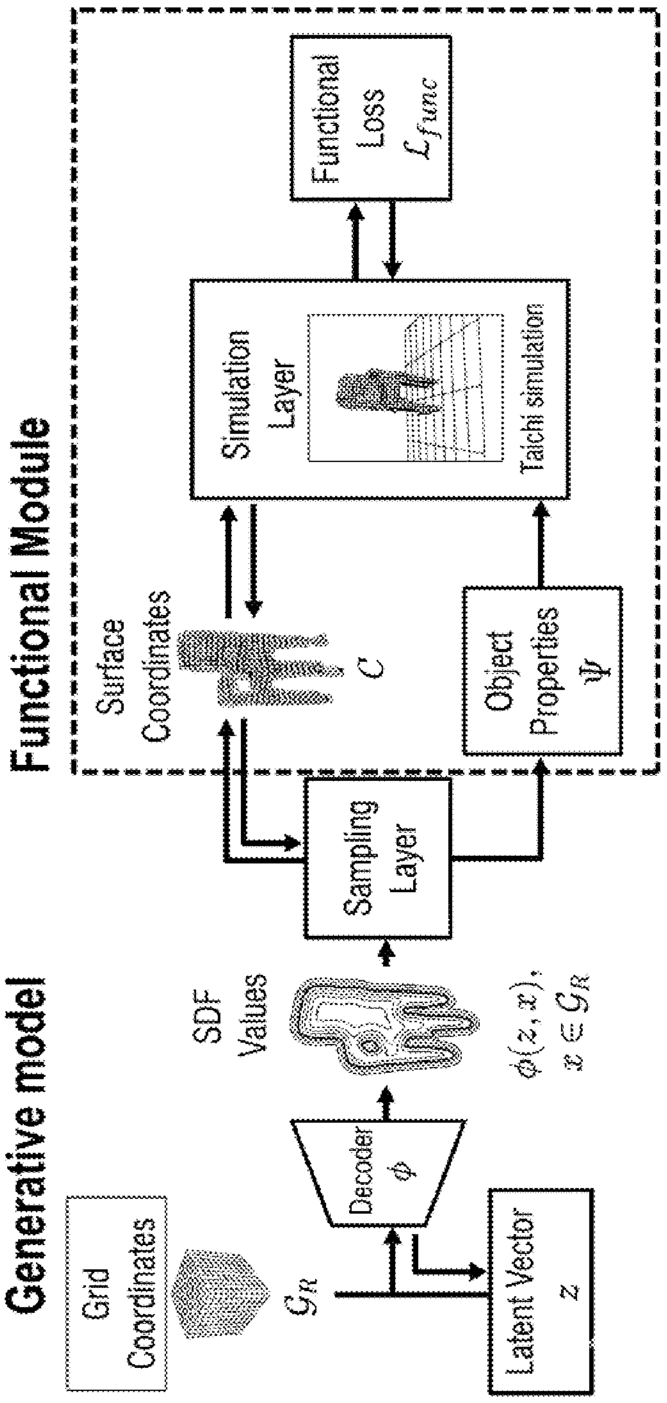
Figure 10:
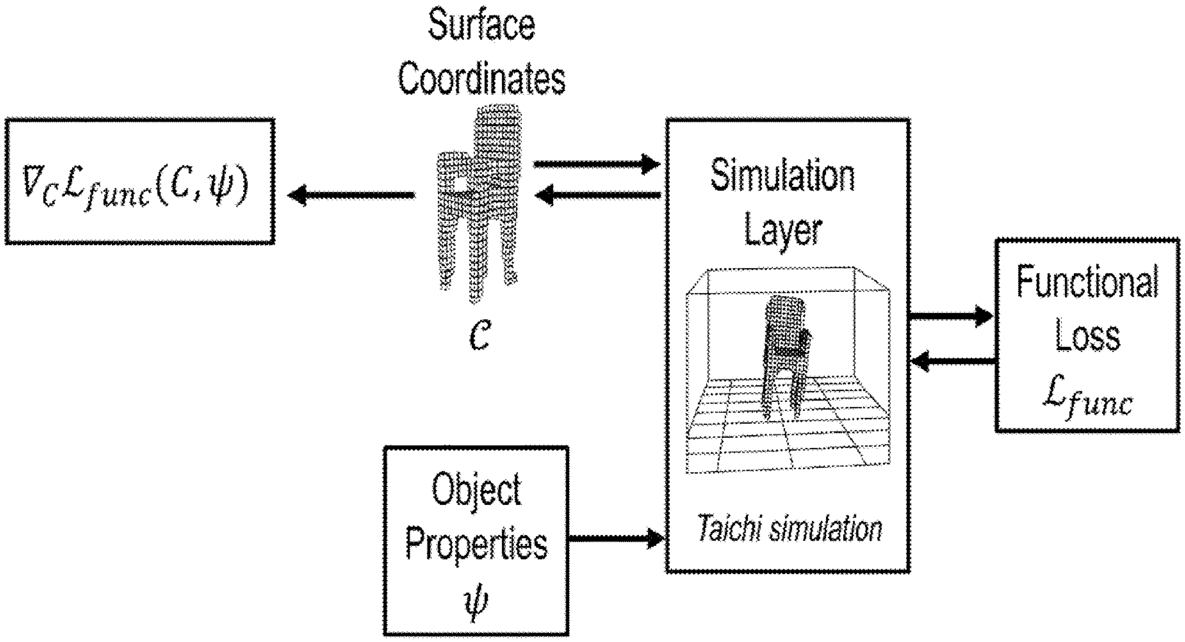
Figure 11:
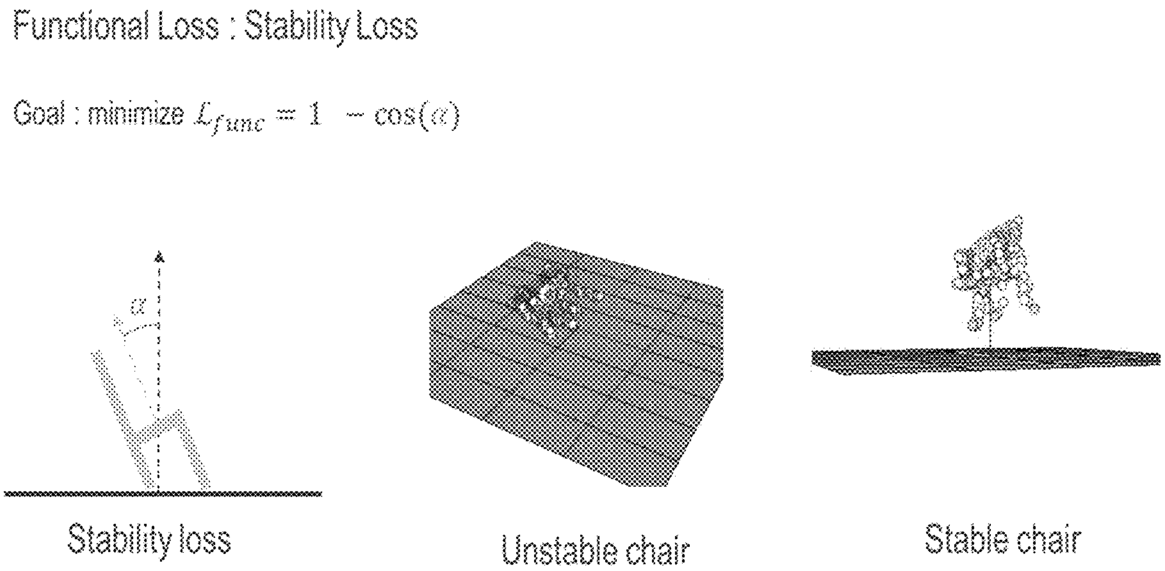
Figure 12:
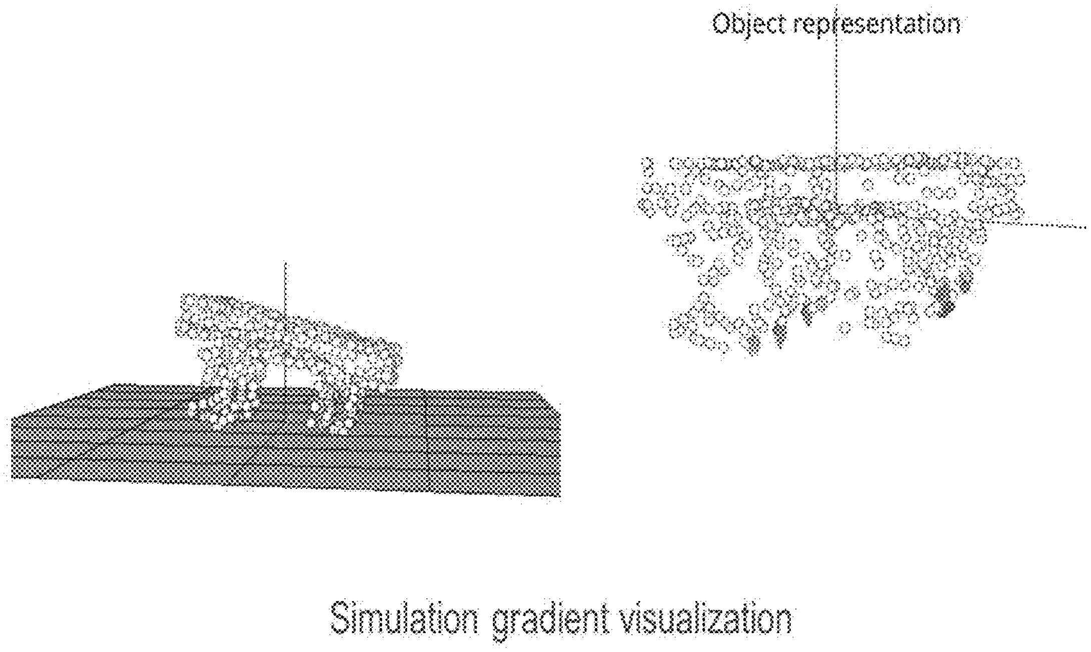
Figure 13:
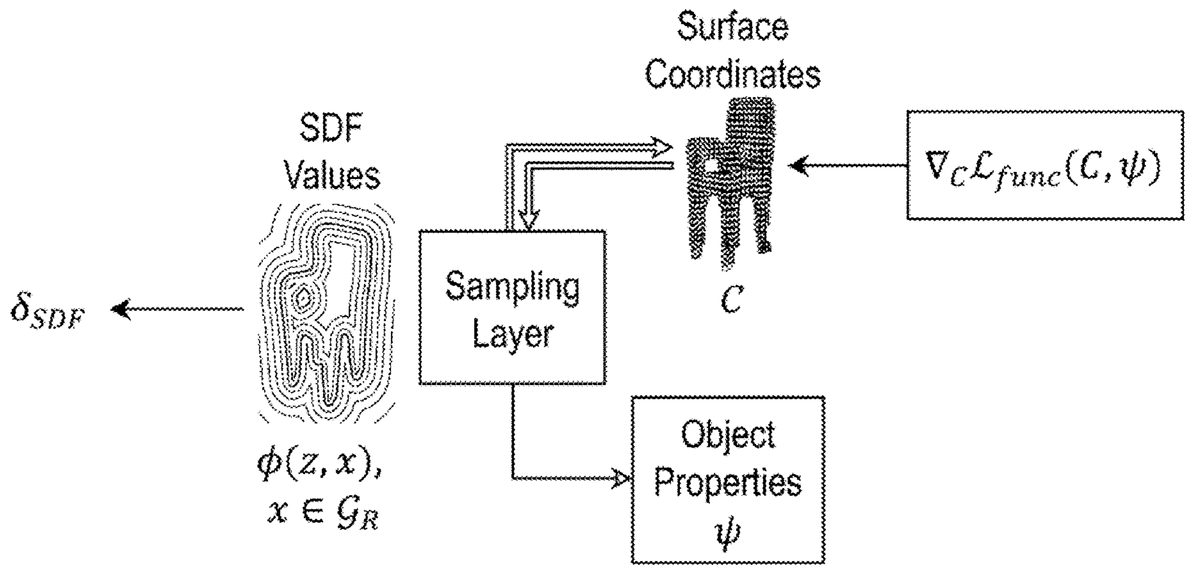
Figure 14:
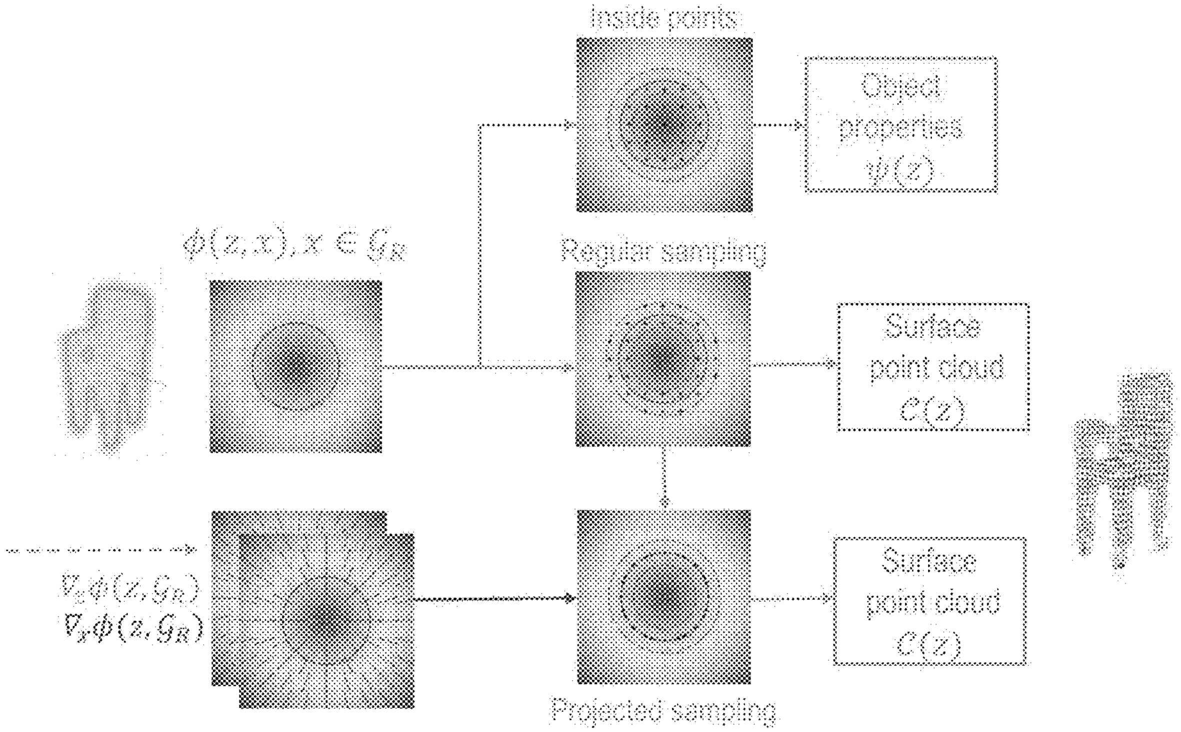
Figure 15:
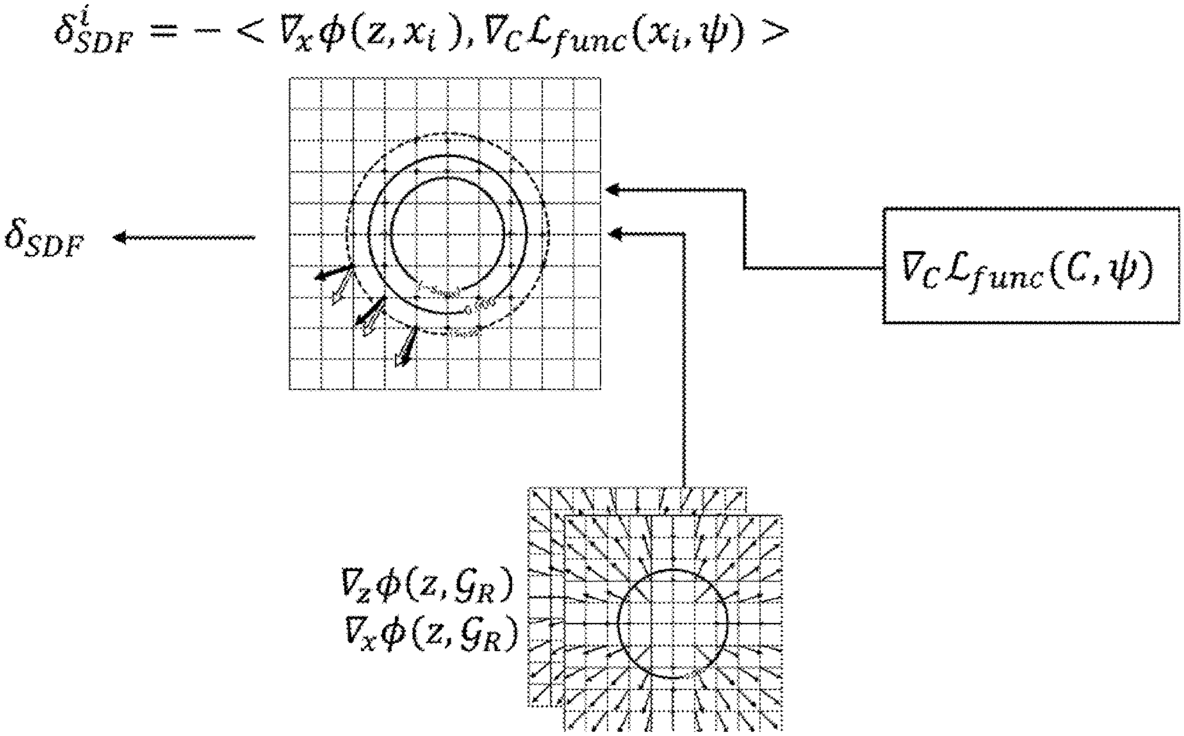
Figure 16:
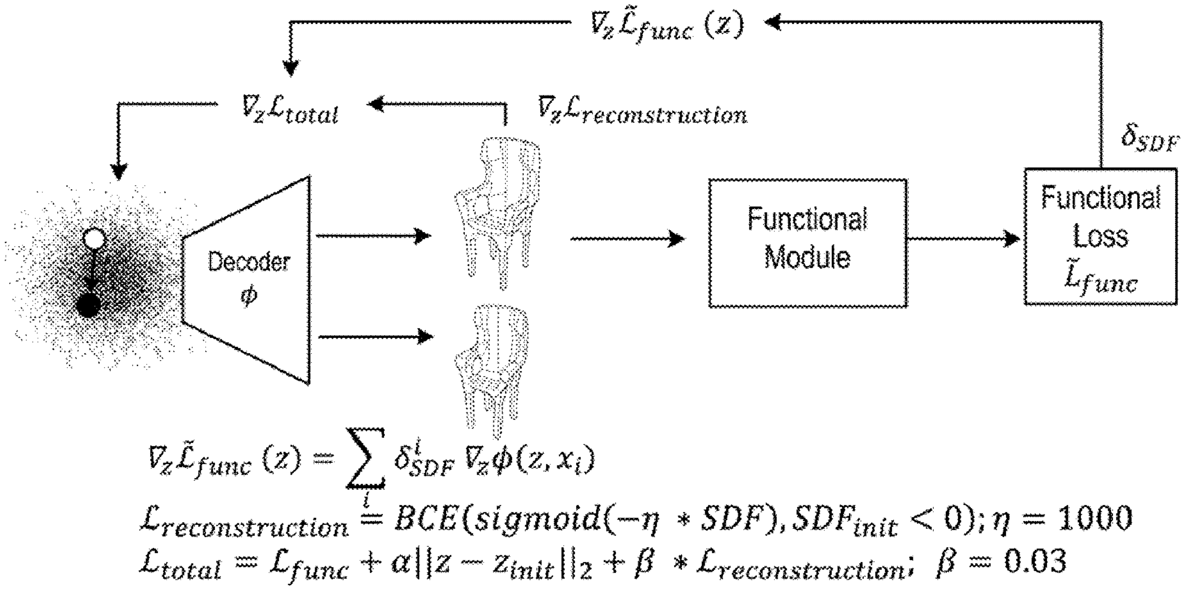

FIG. 9 illustrates the pipeline of the implementation. FIGS. 10-12 illustrate the simulation layer. FIG. 13 illustrates the sampling layer. FIG. 14 illustrate the forward pass of the sampling layer and FIG. 15 illustrates the backward pass of the sampling layer. FIG. 16 illustrates the latent optimization.

Figure 17:
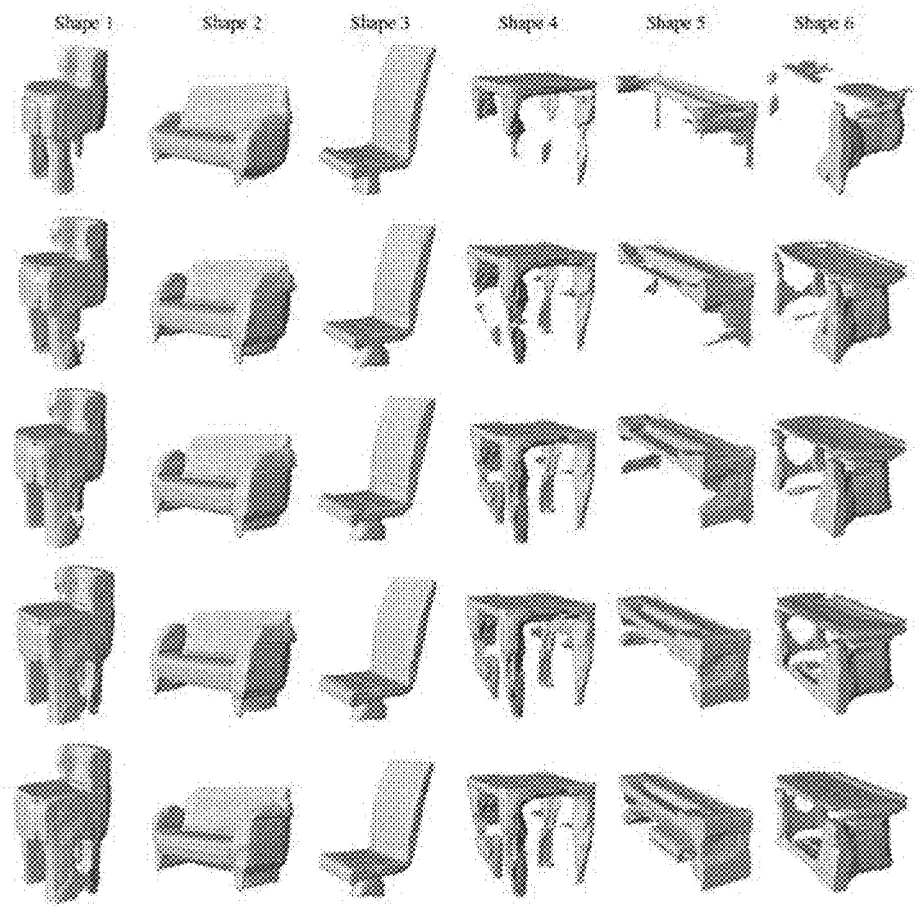

FIG. 17 illustrates various shape optimizations performed with the implementation.

The methods are computer-implemented. This means that steps (or substantially all the steps) of the methods are executed by at least one computer, or any system alike. Thus, steps of the methods are performed by the computer, possibly fully automatically, or, semi-automatically. In examples, the triggering of at least some of the steps of the methods may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g., one for the program, and possibly one for the database).

Figure 18:
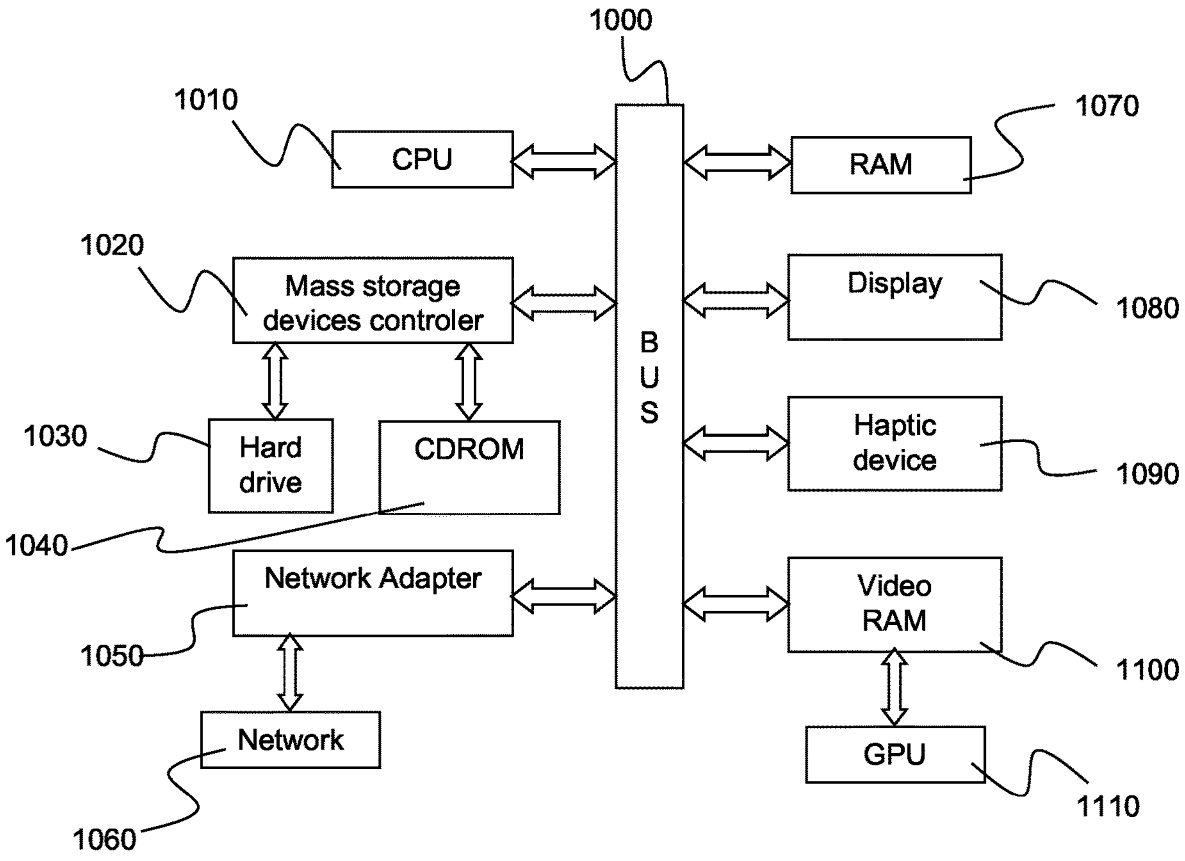
FIG. 18 shows an example of the system.

FIG. 18 shows an example of the system, wherein the system is a client computer system, e.g., a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the learning method and/or the optimization method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the learning method and/or the optimization method.

The invention claimed is:

1. A computer-implemented method of applying a neural network learnable according to machine-learning including:

obtaining a dataset of 3D modeled objects each representing a mechanical part, each 3D modeled object including a specification of a geometry of the mechanical part; and learning a set of parameterization vectors each respective to a respective 3D modeled object of the dataset and a neural network configured to take as input a parameterization vector and to output a representation of a 3D modeled object usable in a differentiable simulation-based shape optimization, the learning including minimizing a loss which penalizes, for each 3D modeled object of the dataset, a disparity between the output of the neural network for an input parameterization vector respective to the 3D modeled object and a representation of the 3D modeled object usable in a differentiable simulation-based shape optimization, wherein the neural network includes:

a decoding neural network configured to take as input a parameterization vector of a 3D modeled object and to output a representation of the 3D modeled object usable in a differentiable simulation-based shape optimization, or an autoencoder comprising an encoder configured to take as input a 3D modeled object and to output a parameterization of the 3D modeled object and a decoder configured to take as input a parameterization vector of a 3D modeled object and to output a representation of the 3D modeled object usable in a differentiable simulation-based shape optimization, and wherein the method is applied for differentiable simulation-based shape optimization, the method comprising:

obtaining a 3D modeled object representing a mechanical part;

obtaining one or more physical constraints on the 3D modeled object;

obtaining a differentiable simulator taking as an input a representation of a 3D modeled object and outputting a value representing an extent to which the 3D modeled object respects the one or more physical constraints; and performing a simulation-based shape optimization of the 3D modeled object by minimizing a loss penalizing a disparity between the value outputted by the simulator for the output of the neural network for a candidate parameterization vector and an optimal output of the simulator with respect to the one or more physical constraints.

2. The method of claim 1, wherein the representation is an implicit representation.

3. The method of claim 2, wherein the implicit representation is a signed distance field representation.

4. The method of claim 1, wherein the set of parameterization vectors is a set of latent vectors.

5. The method of claim 1, wherein:

each 3D modeled object of the obtained dataset further includes a specification of one or more physical attributes of the mechanical part, and the representation is a representation of the geometry and of the one or more physical attributes.

6. The method of claim 1, wherein:

the output of the neural network is an explicit representation of the 3D modeled object parameterized by the candidate parameterization vector and the simulator takes as input an explicit representation of a 3D modeled object, or the output of the neural network is an implicit representation of the 3D modeled object parameterized by the candidate parameterization vector and the simulator takes as input an explicit representation of a 3D modeled object, the performing of the simulation-based shape optimization comprising transforming the implicit representation of the 3D modeled object into an explicit representation.

7. The method of claim 6, wherein the loss further penalizes a disparity between a 3D modeled object parameterized by the candidate parameterization vector and the obtained 3D modeled object.

8. The method of claim 7, wherein the disparity between the 3D modeled object parameterized by the candidate parameterization vector and the 3D modeled object includes:

a disparity between the candidate parameterization vector and a parameterization vector of the obtained 3D modeled object, the parameterization vector being obtained from the obtained 3D modeled object, and/or a disparity between the output of the neural network for the candidate parameterization vector and a representation of the obtained 3D modeled object.

9. The method of claim 8, wherein the loss is of type:

$$d_{\mathbb{R}}(\Psi o \Phi(v', \mathcal{G}_R), f_{opt}) + \alpha d_{\mathbb{R}^D}(v, v') + \beta\, d_s(\Phi(v', \mathcal{G}_R), O),$$

where $\Phi(v', \mathcal{G}_R)$ is the output of neural network $\Phi$ for candidate parameterization vector v', $\Psi$ is the simulator, $f_{opt}$ is the optimal output of the simulation with respect to the one or more physical constraints, v is the parameterization vector of the obtained 3D modeled object, $O=\Psi(v, \mathcal{G}_R)$ is the representation of the obtained 3D modeled object, $d_{\mathbb{R}}$, $d_{\mathbb{R}^D}$, $d_S$ are distances, and α and β are coefficients of the loss.

10. The method of claim 9, wherein the output of the neural network for an input candidate parameterization vector is an implicit representation of the 3D modeled object parametrized the input parameterization vector, the implicit representation being a signed distance field, the simulator takes as input an explicit representation of a 3D modeled object, and distance $d_S$ is of the type:

$$d_S(\Phi(v, \mathcal{G}_R), \Phi(v_2, \mathcal{G}_R)) = BCE(B^{\sigma}(v_2), B^{\mathbb{I}}(v_1)),$$

where for i=1,2, $v_i$ is a parameterization vector, $\Psi(v_i, \mathcal{G}_R)$ is the output of the neural network for the parameterization vector $v_i$, Ψ being the neural network, where $$B^{\mathbb{I}}(v) = \{\mathbb{I}_{\Phi(v,x)<0};\, x \in \mathcal{G}_R\},$$

$$B^{\sigma}(v) = \{\sigma(\eta\, \Phi(v, x));\, x \in \mathcal{G}_R\},$$

η being a negative real number, $\mathbb{I}$ and σ being respectively indicator and sigmoid functions, $\mathcal{G}_R$ being a grid of regularly spaced coordinates, and where BCE is a binary cross entropy distance between two sets X and $\mathcal{Y}$ with size n such as $\forall x \in x \cup \mathcal{Y}$, $x \in [0, 1]$ and is given by formula $$BCE(X, \mathcal{Y}) = \frac{1}{n}\sum_{i=1}^{n} y_i \log(x_i) + (1 - y_i)\log(1 - x_i),$$

where the $x_i$ are the points of X and where the $y_i$ are the points of $\mathcal{Y}$.

11. A non-transitory computer readable medium having stored thereon a program that when executed by a processor causes the processor to implement the method of applying a neural network according to claim 6.

12. A device comprising:

a processor; and a non-transitory computer-readable data storage medium having recorded thereon a computer program comprising instructions that when executed by the processor causes the processor to:

perform machine-learning by being configured to:

obtain a dataset of 3D modeled objects each representing a mechanical part, each 3D modeled object comprising a specification of a geometry of the mechanical part, and learn a set of parameterization vectors each respective to a respective 3D modeled object of the dataset and a neural network configured to take as an input a parameterization vector and to output a representation of a 3D modeled object usable in a differentiable simulation-based shape optimization, the learning including minimizing a loss which penalizes, for each 3D modeled object of the dataset, a disparity between the output of the neural network for an input parameterization vector respective to the 3D modeled object and a representation of the 3D modeled object usable in a differentiable simulation-based shape optimization, and/or apply a neural network learnable according to machine-learning, the neural network being:

a decoding neural network configured to take as input a parameterization vector of a 3D modeled object and to output a representation of the 3D modeled object usable in a differentiable simulation-based shape optimization; or an autoencoder including an encoder configured to take as input a 3D modeled object and to output a parameterization of the 3D modeled object and a decoder configured to take as input a parameterization vector of a 3D modeled object and to output a representation of the 3D modeled object usable in a differentiable simulation-based shape optimization, wherein the instructions being for a differentiable simulation-based shape optimization, and wherein the processor is further configured to:

obtain a 3D modeled object representing a mechanical part, obtain one or more physical constraints on the 3D modeled object, obtain a differentiable simulator taking as input a representation of a 3D modeled object and outputting a value representing an extent to which the 3D modeled object respects the one or more physical constraints, and perform a simulation-based shape optimization of the 3D modeled object by minimizing a loss penalizing a disparity between the value outputted by the simulator for the output of the neural network for a candidate parameterization vector and an optimal output of the simulator with respect to the one or more physical constraints.

13. The device of claim 12, wherein the representation is an implicit representation.

14. The device of claim 13, wherein the implicit representation is a signed distance field representation.

15. The device of claim 12, wherein:

the output of the neural network is an explicit representation of the 3D modeled object parameterized by the candidate parameterization vector and the simulator takes as input an explicit representation of a 3D modeled object, or the output of the neural network is an implicit representation of the 3D modeled object parameterized by the candidate parameterization vector and the simulator takes as input an explicit representation of a 3D modeled object, the performing of the simulation-based shape optimization including transforming the implicit representation of the 3D modeled object into an explicit representation.

16. The device of claim 12, wherein the loss further penalizes a disparity between a 3D modeled object parameterized by the candidate parameterization vector and the obtained 3D modeled object.

17. The device of claim 16, wherein the disparity between the 3D modeled object parameterized by the candidate parameterization vector and the 3D modeled object includes:

a disparity between the candidate parameterization vector and a parameterization vector of the obtained 3D modeled object, the parameterization vector being obtained from the obtained 3D modeled object, and/or a disparity between the output of the neural network for the candidate parameterization vector and a representation of the obtained 3D modeled object.

18. The device of claim 17, wherein the loss is of type:

$$d_{\mathbb{R}}\left(\Psi o\Phi\left(v', \mathcal{G}_R\right), f_{opt}\right) + \alpha d_{\mathbb{R}^D}(v, v') + \beta\, d_s\left(\Phi\left(v', \mathcal{G}_R\right), O\right),$$

where $\Phi(v', \mathcal{G}_R)$ is the output of neural network $\Phi$ for candidate parameterization vector v', $\Psi'$ is the simulator, $f_{opt}$ is the optimal output of the simulation with respect to the one or more physical constraints, v is the parameterization vector of the obtained 3D modeled object, $0=\Phi(v, \mathcal{G}_R)$ is the representation of the obtained 3D modeled object, $d_{\mathbb{R}}$, $d_{\mathbb{R}^D}$, $d_S$ are distances, and $\alpha$ and $\beta$ are coefficients of the loss.

* * * * *